(12) United States Patent
Ikuta et al.

(10) Patent No.: US 9,324,861 B2
(45) Date of Patent: Apr. 26, 2016

(54) SEMICONDUCTOR DEVICE

(71) Applicant: Panasonic Intellectual Property Management Co., Ltd., Osaka (JP)

(72) Inventors: Teruhisa Ikuta, Toyama (JP); Akira Fukumoto, Toyama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/609,965

(22) Filed: Jan. 30, 2015

(65) Prior Publication Data

US 2015/0162440 A1 Jun. 11, 2015

Related U.S. Application Data

(63) Continuation of application No. PCT/JP2013/003731, filed on Jun. 13, 2013.

(30) Foreign Application Priority Data

Aug. 30, 2012 (JP) .................. 2012-189913

(51) Int. Cl.
*H01L 29/78* (2006.01)
*H01L 29/66* (2006.01)
(Continued)

(52) U.S. Cl.
CPC .......... *H01L 29/7816* (2013.01); *H01L 29/086* (2013.01); *H01L 29/0808* (2013.01); *H01L 29/0821* (2013.01); *H01L 29/0847* (2013.01); *H01L 29/0878* (2013.01); *H01L 29/1095* (2013.01); *H01L 29/66325* (2013.01); *H01L 29/7393* (2013.01); *H01L 29/7394* (2013.01);
(Continued)

(58) Field of Classification Search
CPC ............ H01L 29/7816; H01L 29/1095; H01L 29/0821; H01L 29/0878; H01L 29/7393; H01L 29/0808; H01L 29/086; H01L 29/7835
USPC .................................................. 257/139, 343
See application file for complete search history.

(56) References Cited

U.S. PATENT DOCUMENTS 5,382,536 A    1/1995  Malhi et al.
5,969,400 A *  10/1999 Shinohe et al. ............... 257/492
(Continued)

FOREIGN PATENT DOCUMENTS

JP    2000-307122 A    11/2000
JP    2008-147415 A    6/2008
(Continued)

OTHER PUBLICATIONS

International Search Report issued in PCT/JP2013/003731, dated Sep. 17, 2013, with English translation.

*Primary Examiner* — Christine Enad
(74) *Attorney, Agent, or Firm* — McDermott Will & Emery LLP

(57) ABSTRACT

A semiconductor device has on a semiconductor layer: a gate insulating film formed, extending from a second emitter region toward a buffer region beyond a first body region, and covering part of a drift region; and a gate electrode. The second emitter region contacts a first emitter region, and extends laterally to a portion under the gate electrode so as to be longer than a diffusion depth of the second emitter region and not beyond a lateral length of the first body region under the gate electrode, in an area from an end portion of the first emitter region closer to the gate electrode to a region under the gate electrode.

18 Claims, 16 Drawing Sheets

(51) Int. Cl.
    *H01L 29/739*   (2006.01)
    *H01L 29/10*    (2006.01)
    *H01L 29/08*    (2006.01)

(52) U.S. Cl.
    CPC ........ *H01L 29/7824* (2013.01); *H01L 29/7835*
              (2013.01); *H01L 29/1045* (2013.01)

(56) References Cited

U.S. PATENT DOCUMENTS

| | | | |
|---|---|---|---|
| 6,700,160 | B1 | 3/2004 | Merchant |
| 7,268,045 | B2 | 9/2007 | Hower et al. |
| 2005/0255655 | A1 | 11/2005 | Hower et al. |
| 2008/0135972 | A1* | 6/2008 | Ikuta et al. ............... 257/492 |
| 2009/0242930 | A1* | 10/2009 | Lu ............................. 257/141 |
| 2010/0213509 | A1 | 8/2010 | Ikuta et al. |
| 2011/0081751 | A1 | 4/2011 | Ikuta et al. |
| 2011/0169046 | A1 | 7/2011 | Ikuta et al. |

FOREIGN PATENT DOCUMENTS

| | | |
|---|---|---|
| JP | 2009-290140 A | 12/2009 |
| JP | 2010-114298 A | 5/2010 |
| JP | 2010-245339 A | 10/2010 |

\* cited by examiner

SEMICONDUCTOR DEVICE

CROSS-REFERENCE TO RELATED APPLICATIONS

This is a continuation of International Application No. PCT/JP2013/003731 filed on Jun. 13, 2013, which claims priority to Japanese Patent Application No. 2012-189913 filed on Aug. 30, 2012. The entire disclosures of these applications are incorporated by reference herein.

BACKGROUND

The present disclosure relates to semiconductor devices, and specifically relates to insulated gate bipolar transistors (IGBTs) and horizontal MOS transistors.

In recent years, associated with a significant decline in prices of color plasma display panels (PDPs), there is a huge demand for a reduction in cost of semiconductor devices used therein. In many cases, in a scan driver IC of the color PDP, a silicon integrated circuit having a horizontal IGBT and a control circuit with a low breakdown voltage which are provided as one chip on an SOI substrate, is employed as an output drive device.

In order to reduce cost of the scan driver IC, reducing the size of the horizontal IGBT, which occupies a large area in a chip, is very effective, but to do so, it is necessary to improve the current capability of the horizontal IGBT.

The current capability of the horizontal IGBT needs to be examined mainly from two viewpoints, that is, performance characteristics such as an on-state voltage and a saturation current, and element breakdown such as on breakdown voltage or the safe operating area (SOA) and the electro-static discharge (ESD). Since the present disclosure is effective not only for the IGBTs but also for the MOS transistors, the term "saturation current" used herein refers to a saturation current similar to a saturation current in the MOS transistors, that is, a collector current in an area exhibiting a tendency to saturate. The on breakdown voltage is a collector voltage which breaks down in the on state. The SOA refers to the on breakdown voltage and operable current-voltage ranges which can be defined by a breakdown current of the on breakdown voltage. Thus, the on breakdown voltage and the SOA can be considered as having a similar meaning in the present disclosure. Further, regarding the saturation current, the on breakdown voltage, and the SOA, both of a direct current (DC) input and a pulse input need to be considered.

In the present disclosure, the inventors measured the on breakdown voltage of an IGBT by applying a pulse signal with a width of 100 ns to a collector, using a transmission line pulse (TLP) measurement device. On the other hand, the saturation current is measured by an input of a DC signal.

The on breakdown voltage is lowered as the saturation current increases. Thus, in general, there is a trade-off relationship between the on breakdown voltage and the saturation current.

The saturation current relies on the resistance component mainly at a time when the device is in the on state. A channel resistance that occurs in a region under a gate insulating film is one of main resistance components. It is thus important to reduce the channel resistance. Further, in order to increase the on breakdown voltage, it is important to reduce latch-up. An equivalent circuit of the horizontal IGBT has a thyristor structure as shown in FIG. 16. Once the thyristor operates and latch-up occurs, the latch-up cannot be controlled by a gate voltage. This leads to a low impedance state, and heat causes breakdown. One of conditions of occurrence of the latch-up is $\alpha_{(NPN)}+\alpha_{(PNP)} \geq 1$ where $\alpha_{(NPN)}$ and $\alpha_{(PNP)}$ are a common-base current gain of a parasitic NPN transistor and a common-base current gain of a parasitic PNP transistor, respectively. This means that it is important to reduce the current gain $\alpha$ of each of the bipolar transistors in order to reduce the occurrence of the latch-up.

Since the performance characteristics of the PNP transistor retate to the saturation current, if the current gain $\alpha$ is reduced too much, the superiority of the PNP transistor over the MOS transistor will be reduced. Thus, to avoid latch-up, the focus is placed on controlling a turn-on operation (hereinafter referred to as "on operation") of the parasitic NPN transistor. In particular, to control the on operation of the parasitic NPN transistor, it is effective to reduce a body resistance Rb of a lower portion of an emitter region. If a collector current increases when the horizontal IGBT is in the on state, the voltage drops significantly in a P type body region at a parasitic resistance Rb. If this voltage drop becomes equal to or exceeds a built-in potential Vbi, the on operation starts. For this reason, reducing the parasitic resistance Rb is particularly important.

As a conventional structure that can improve the trade-off relationship, a device structure in which a body region has a retrograde profile has been suggested as disclosed in Japanese Unexamined Patent Publication No. 2008-147415 (Patent Document 1).

In the retrograde profile, the impurity concentration is increased from a surface (hereinafter also referred to as a Si surface) of a silicon (Si) layer in a depth direction, and the impurity concentration peaks at a lower portion of the emitter region. It is therefore possible to reduce the parasitic resistance Rb while reducing an increase in a channel resistance.

FIG. 17 shows a schematic cross section of an element structure of the horizontal IGBT disclosed in Patent Document 1. As shown in FIG. 17, a P type first body region 4, a P⁻ type second body region 5, an N⁻ type drift region 6, and an N type buffer region 7 are formed in an upper portion of an SOI substrate formed by adhering a supporting substrate 1, a buried insulating film 2, and a low concentration P type semiconductor layer 3. A high concentration N⁺ type first emitter region 8 and an N type second emitter region 9 of which the concentration is lower and the diffusion depth is deeper than the concentration and the diffusion depth of the first emitter region 8 are formed in an upper portion of the first body region 4. In general, the first emitter region 8 and the second emitter region 9 also serve as an N type source region and an N type drain region of a low breakdown voltage N channel MOS in a logic element integrated in the same chip. In general, the N type source region and the N type drain region are formed by two types of diffusion layers including a high concentration N type region for ohmic contact and a low concentration N type region called lightly-doped-drain (LDD). The diffusion depth of the second emitter region 9 corresponding to the low concentration diffusion layer (LDD) is deeper, in general, than the diffusion depth of the first emitter region 8 corresponding to the high concentration diffusion layer.

A P⁺ type collector region 10 formed on the surface of the N type buffer region 7 and a P⁺ type body contact diffusion region 11 formed on the surface of the first body region 4 are made of the same high concentration diffusion layer. A gate electrode 13 extends from above a gate insulating film 12 to above a field oxide film 15. A sidewall spacer 14 is provided on a sidewall of the gate electrode 13. An emitter electrode 16 is formed on the first emitter region 8 and the body contact diffusion region 11. A collector electrode 17 is formed on the collector region 10.

The first body region 4 has a vertical concentration distribution in which the P type impurity concentration increases from the surface of the P type semiconductor layer 3 and peaks at a lower portion of the emitter region 8, and extends in a lateral direction to diffuse into part of the region under the emitter region 8. The lateral length of the impurity diffusion from the highest impurity concentration portion under the end of the gate electrode 13 closer to the emitter region 8 to a region under the gate electrode 13 is equivalent to or longer than the vertical length of the impurity diffusion from the highest impurity concentration portion toward the supporting substrate.

Here, in the first body region 4 whose impurity concentration increases from the Si surface in the depth direction and which includes the highest impurity concentration portion under the emitter region 8 (this is called a retrograde profile and a characteristic of the Patent Document 1), the parasitic resistance of the first body region 4 under the emitter region 8 can be reduced, and therefore, the first body region 4 has an effect on the control of the operation of the parasitic bipolar transistor. Further, the first body region 4 extends from under the end of the gate electrode 13 closer to the emitter region 8 to a region under the gate electrode 13, that is, toward the collector region 10. This configuration can reduce the current gain of the parasitic bipolar transistor in the lateral direction, and therefore has an effect on the control of the operation of the parasitic bipolar transistor. As a result, a breakdown current at which the parasitic bipolar transistor operates can be increased, and the on breakdown voltage can be increased. Further, since the first body region 4 has a retrograde profile, even if the first body region 4 is made to have a high impurity concentration at its deep portion, it is possible to reduce effects on an increase in impurity concentration of the Si surface. As a result, the saturation current can be increased without an increase in a channel resistance, and it is possible to improve the trade-off relationship between the on breakdown voltage and the saturation current.

Next, a method for manufacturing a conventional structure shown in Patent Document 1 will be described using a schematic flow diagram of cross sections of FIG. 18A to FIG. 18F.

First, as shown in FIG. 18A, a supporting substrate 1, a buried oxide film 2 with a thickness of 2.0 μm, and a p-type semiconductor layer 3 with a thickness of 3.5 μm are adhered together to form an SOI substrate, on which a commonly-used diffusion technique, such as ion implantation, photolithography and a drive-in technique (a heat treatment), is repeatedly performed to sequentially form a second body region 5, an N type buffer region 7, and an N⁻ type drift region 6 in the p-type semiconductor layer 3.

Next, as shown in FIG. 18B, a field oxide film 15 with a thickness of 540 nm is formed in an upper portion of the N⁻ type drift region 6 so as to overlap with part of the N type buffer region 7. After that, boron (B) ions are implanted in an upper portion of the second body region 5 at acceleration energy of 180 keV and a dose amount of from about 5E+13 ions/cm² to about 9E+13 ions/cm², thereby forming a first body region 4.

Next, as shown in FIG. 18C, a gate insulating film 12 is formed on a region extending from an end portion of the first body region 4 closer to the field oxide film 15 to the field oxide film 15. After that, a gate electrode 13 made of an N type polysilicon film doped with phosphorus (P) at a high concentration is formed on the gate insulating film 12.

Next, as shown in FIG. 18D, phosphorus (P) ions are implanted in an upper portion of the first body region 4 at acceleration energy of 70 keV and a dose amount of about 4E+13 ions/cm², thereby forming an N type second emitter region 9. Since the gate electrode 13 and the second emitter region 9 are formed in a self-aligned manner, the second emitter region 9 only slightly enters in a region under the gate electrode 13, and the end portion of the second emitter region 9 closer to the gate electrode 13 almost coincides with the end portion of the gate electrode 13 closer to the second emitter region 9.

Next, as shown in FIG. 18E, a sidewall spacer 14 is formed on a side surface of the gate electrode 13, using a CVD insulating film. After that, arsenic (As) ions are implanted in the second emitter region 9, thereby forming a high concentration N⁺ type first emitter region 8.

Next, as shown in FIG. 18F, a p⁺ type body contact region 11 and a p⁺ type collector region 10 are simultaneously formed by BF₂ ion implantation. After that, although not shown, an insulating film is formed on the entire surface, and contact holes are selectively formed in part of the insulating film. Then, a multilayer structure comprised of a metal interconnect that includes an emitter electrode and a collector electrode, and of the insulating film is formed. Further, an insulating film for protection is formed to cover the surface.

The trade-off relationship between the on breakdown voltage and the saturation current can be further improved if the device technique disclosed in U.S. Pat. No. 6,700,160 (Patent Document 2) is used. Specifically, in Patent Document 2, N type impurity ions opposite to the conductivity type (P type) of the body region are implanted in a channel surface, thereby reducing a P type impurity concentration near the surface of the body region. The N type impurities are implanted to a diffusion depth that does not affect a deep portion of the body region. Thus, effects on a reduction of the on breakdown voltage can be reduced.

Next, a schematic cross section of an element structure when the structure in Patent Document 2 is applied to the structure in Patent Document 1 is shown in FIG. 19. An N type surface diffusion region 18 is a region added by the combination with Patent Document 2, and that is a difference from the structure in Patent Document 1.

The surface diffusion region 18 is formed in the Si surface from an end portion of the second emitter region 9 to an end portion of the field oxide film 15 closer to the gate electrode 13. Due to the surface diffusion region 18, the P type impurity concentration of the surface of the P type first body region 4 is reduced, and a threshold voltage is reduced. At the same time, the channel length is shortened and the channel resistance is reduced. As a result, the saturation current can be increased.

Since the surface diffusion region 18 is provided so as to slightly overlap the second emitter region 9, the surface diffusion region 18 does not reduce the P type impurity concentration of the first body region 4 located under the first emitter region 8. Further, since the parasitic resistance Rb does not increase, it is possible to reduce an effect on the on operation of the parasitic NPN transistor.

SUMMARY

As described in the above background, the conventional structure of Patent Document 1 or the conventional structure of Patent Document 1 combined with a structure of Patent Document 2, for improving the current capability of the horizontal IGBT, is a device structure that can improve the trade-off relationship between the saturation current and the on breakdown voltage.

However, another problem occurs in aiming at a further reduction in size of the horizontal IGBT.

First, in the conventional structure of Patent Document 1, the channel resistance is increased in the overlapping region in which the gate electrode and the first body region overlap each other and which significantly affects the current capability, such as a threshold voltage and a saturation current, and this leads to a substantial increase in the channel region. This means that the saturation current is increased more by reducing the dimensions of the overlapping region. However, if the dimensions of the overlapping region are reduced too much, that leads to a reduction in the threshold voltage and variations in the saturation current, and unstable performance characteristics.

Further, the gate electrode and the first body region are not formed in a self-aligned manner. Thus, the dimensions of the overlapping region need to include a margin, considering the displacement of a mask for forming the gate electrode and a mask for forming the first body region in a photolithography step. This results in a substantial extension of the channel length more than necessary, and leads to a reduction in the saturation current.

Further, regarding the on breakdown voltage, it is necessary to consider the case in which the overlapping dimensions between the gate electrode and the first body region are reduced by the amount of displacement. In the case where the overlapping dimensions are reduced, the P type impurity concentration corresponding to the base of the horizontal parasitic NPN transistor is reduced. As a result, the current gain $\alpha$ is increased, and this makes the on operations happen more easily and leads to a reduction in the on breakdown voltage. This means that there is a substantial limitation in improving the trade-off relationship between the saturation current and the on breakdown voltage by shortening the channel length.

Next, in the conventional structure of Patent Document 1 combined with a structure of Patent Document 2, the effective channel length can be shortened by forming a surface diffusion layer having a conductivity type opposite to the conductivity type of the body region. This conventional structure is therefore a structure that allows further improvement in the trade-off relationship between the saturation current and the on breakdown voltage. However, this conventional structure has a problem that the threshold voltage largely depends on the dose amount of implantation in the surface diffusion layer, and that the threshold voltage easily varies.

On the other hand, in the manufacturing sites, it is common that the impurity concentration is varied by an ion implantation apparatus, and a heat treatment such as annealing and a drive-in technique. Thus, if the threshold voltage depends too much on the impurity concentration, it means that the threshold voltage and the saturation current significantly vary in a wafer plane, between wafers, and between lots, which results in a reduction in yield.

In view of the above problems, the present disclosure is intended to improve an on breakdown voltage, while increasing a saturation current of a semiconductor device.

To solve the above problems, the first semiconductor device includes: a semiconductor layer formed above one principal surface of a supporting substrate, with a buried insulating film interposed therebetween; a first body region of a first conductivity type formed in an upper portion of the semiconductor layer; a drift region of a second conductivity type formed in an upper portion of the semiconductor layer to be adjacent to the first body region or apart from the first body region; a buffer region of the second conductivity type formed in an upper portion of the drift region; a first emitter region of the second conductivity type and a second emitter region of the second conductivity type having a concentration lower than a concentration of the first emitter region, the first emitter region and the second emitter region being formed in upper portions of the first body region; a collector region of the first conductivity type formed in an upper portion of the buffer region; a body contact region of the first conductivity type formed in an upper portion of the semiconductor layer such that at least part of the body contact region contacts the first body region; a gate insulating film formed on the semiconductor layer, extending from the second emitter region toward the buffer region beyond the first body region, and covering part of the drift region, and a gate electrode formed on the gate insulating film; and an emitter electrode contacting the first emitter region and the body contact region, and a collector electrode contacting the collector region, the emitter electrode and the collector electrode being formed on the semiconductor layer, wherein the second emitter region contacts the first emitter region, and extends laterally to a portion under the gate electrode so as to be longer than a diffusion depth of the second emitter region and not beyond a lateral length of the first body region under the gate electrode, in an area from an end portion of the first emitter region closer to the gate electrode to a region under the gate electrode.

The second semiconductor device includes: a semiconductor layer of a second conductivity type formed above one principal surface of a supporting substrate, with a buried insulating film interposed therebetween; a first body region of a first conductivity type formed in an upper portion of the semiconductor layer; a buffer region of the second conductivity type formed in an upper portion of the semiconductor layer to be apart from the first body region; a first emitter region of the second conductivity type and a second emitter region of the second conductivity type having a concentration lower than a concentration of the first emitter region, the first emitter region and the second emitter region being formed in upper portions of the first body region; a collector region of the first conductivity type formed in an upper portion of the buffer region; a body contact region of the first conductivity type formed in an upper portion of the semiconductor layer such that at least part of the body contact region contacts the first body region; a gate insulating film formed on the semiconductor layer, extending from the second emitter region toward the buffer region beyond the first body region, and covering part of the semiconductor layer, and a gate electrode formed on the gate insulating film; and an emitter electrode contacting the first emitter region and the body contact region, and a collector electrode contacting the collector region, the emitter electrode and the collector electrode being formed on the semiconductor layer, wherein the second emitter region contacts the first emitter region, and extends laterally to a portion under the gate electrode so as to be longer than a diffusion depth of the second emitter region and not beyond a lateral length of the first body region under the gate electrode, in an area from an end portion of the first emitter region closer to the gate electrode to a region under the gate electrode.

In the first and second semiconductor devices, the diffusion depth of the second emitter region is preferably shallower than a diffusion depth of the body contact region.

In the first and second semiconductor devices, the diffusion depth of the second emitter region is preferably shallower than a diffusion depth of the first emitter region. In the first and second semiconductor devices, a sheet resistance of the second emitter region is preferably larger than a sheet resistance of the first body region.

In the first and second semiconductor devices, a peak value of an impurity concentration of the second emitter region is preferably in a range of one to ten times a peak value of an impurity concentration of the first body region.

In the first and second semiconductor devices, a peak value of an impurity concentration of the second emitter region is preferably in a range of 1E+18 atoms/cm$^3$ to 1E+19 atoms/cm$^3$.

In the first and second semiconductor devices, the diffusion depth of the second emitter region is preferably in a range of 0.05 µm to 0.2 µm.

The third semiconductor device includes: a semiconductor substrate of a first conductivity type; a first body region of the first conductivity type formed in an upper portion of the semiconductor substrate on one principal surface side; a drift region of a second conductivity type formed in an upper portion of the semiconductor substrate on the one principal surface side to be adjacent to the first body region or apart from the first body region; a buffer region of the second conductivity type formed in an upper portion of the drift region; a first source region of the second conductivity type and a second source region of the second conductivity type having a concentration lower than a concentration of the first source region, the first source region and the second source region being formed in upper portions of the first body region; a drain region of the second conductivity type formed in an upper portion of the buffer region; a body contact region of the first conductivity type formed in an upper portion of the semiconductor substrate on the one principal surface side such that at least part of the body contact region contacts the first body region; a gate insulating film formed on the semiconductor substrate, extending from the second source region toward the buffer region beyond the first body region, and covering part of the drift region, and a gate electrode formed on the gate insulating film; and a source electrode contacting the first source region and the body contact region, and a drain electrode contacting the drain region, the source electrode and the drain electrode being formed on the semiconductor substrate, wherein the second source region contacts the first source region, and extends laterally to a portion under the gate electrode so as to be longer than a diffusion depth of the second source region and not beyond a lateral length of the first body region under the gate electrode, in an area from an end portion of the first source region closer to the gate electrode to a region under the gate electrode.

The fourth semiconductor device includes: a semiconductor substrate of a first conductivity type; an epitaxial region of the second conductivity type formed in an upper portion of the semiconductor substrate on one principal surface side; a first body region of the first conductivity type formed in an upper portion of the epitaxial region; a buffer region of the second conductivity type formed in an upper portion of the epitaxial region to be apart from the first body region; a first source region of the second conductivity type and a second source region of the second conductivity type having a concentration lower than a concentration of the first source region, the first source region and the second source region being formed in upper portions of the first body region; a drain region of the second conductivity type formed in an upper portion of the buffer region; a body contact region of the first conductivity type formed in an upper portion of the semiconductor substrate on the one principal surface side such that at least part of the body contact region contacts the first body region; a gate insulating film formed on the semiconductor substrate, extending from the second source region toward the buffer region beyond the first body region, and covering part of the epitaxial region, and a gate electrode formed on the gate insulating film; and a source electrode contacting the first source region and the body contact region, and a drain electrode contacting the drain region, the source electrode and the drain electrode being formed on the semiconductor substrate, wherein the second source region contacts the first source region, and extends laterally to a portion under the gate electrode so as to be longer than a diffusion depth of the second source region and not beyond a lateral length of the first body region under the gate electrode, in an area from an end portion of the first source region closer to the gate electrode to a region under the gate electrode.

In the third and fourth semiconductor devices, the diffusion depth of the second source region is preferably shallower than a diffusion depth of the body contact region.

In the third and fourth semiconductor devices, the diffusion depth of the second source region is preferably shallower than a diffusion depth of the first source region.

In the third and fourth semiconductor devices, a sheet resistance of the second source region is preferably larger than a sheet resistance of the first body region.

In the third and fourth semiconductor devices, a peak value of an impurity concentration of the second source region is preferably in a range of one to ten times a peak value of an impurity concentration of the first body region.

In the third and fourth semiconductor devices, a peak value of an impurity concentration of the second source region is preferably in a range of 1E+18 atoms/cm$^3$ to 1E+19 atoms/cm$^3$.

In the third and fourth semiconductor devices, the diffusion depth of the second source region is preferably in a range of 0.05 µm to 0.2 µm.

In the first to fourth semiconductor devices, the first body region preferably has a retrograde profile.

The first to fourth semiconductor devices preferably further include a second body region of the first conductivity type formed under the first body region so as to contact the first body region, and having a concentration lower than and a diffusion depth deeper than those of the first body region.

According to a semiconductor device of the present disclosure, it is possible to improve an on breakdown voltage, while increasing a saturation current in a transistor operation.

DETAILED DESCRIPTION

A semiconductor device of the present disclosure will be described in detail with reference to the drawings.

(First Embodiment)

Figure 1:
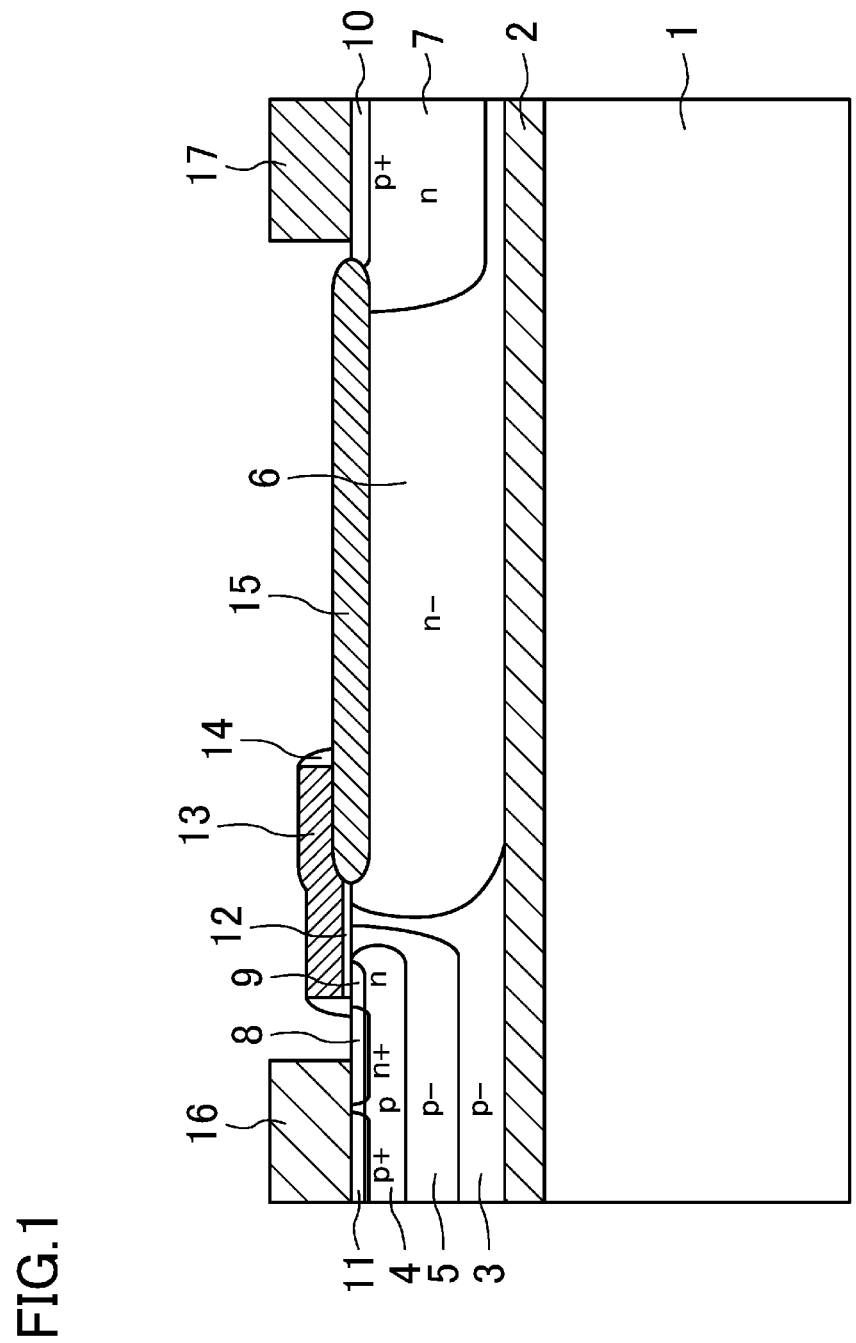
FIG. 1 is a schematic cross section of a horizontal IGBT of the first embodiment.

FIG. 1 schematically shows a cross section of the element structure of a semiconductor device of the first embodiment.

As shown in FIG. 1, a P type semiconductor layer 3 with a thickness of 3.5 μm is formed above a supporting substrate 1, with a buried insulating film 2 with a thickness of 2.0 μm interposed therebetween. A P type first body region 4 is formed in the surface of the P type semiconductor layer 3.

The P type impurity concentration of the first body region 4 is low in the Si surface, that is about 1E+16 atoms/cm$^3$ to 4E+17 atoms/cm$^3$. The concentration increases with an increase in depth, and shows a maximum value at a depth of about 0.5 μm. The peak concentration is about 1E+18 atoms/cm$^3$. The P type impurity concentration is lowered with a further increase in depth from a portion showing the peak concentration, which is a so-called retrograde profile.

A P type second body region 5 is formed to contact with at least part of the first body region 4. The P type second body region 5 has a surface concentration of about 1E+16 atoms/cm$^3$ that is lower than the surface concentration of the first body region 4, but a diffusion depth of the P type second body region 5 is greater than the diffusion depth of the first body region 4.

An N$^-$ type drift region 6 with a low concentration is formed from the surface of the P type semiconductor layer 3 and apart from the second body region 5 in a lateral direction. An N type buffer region 7 with an intermediate concentration is formed in the N$^-$ type drift region 6. An N$^+$ type first emitter region 8 with a high concentration and an N type second emitter region 9 with a concentration lower than that of the first emitter region 8 are formed in upper portions of the first body region 4.

A P$^+$ type collector region 10 is formed in an upper portion of the N type buffer region 7. A P$^+$ type body contact diffusion region 11 made of the same diffusion layer as the collector region 10 is formed in an upper portion of the first body region 4 or the second body region 5. Further, a gate insulating film 12 is formed on the first body region 4 to extend from one end of the first emitter region 8 toward the N$^-$ type drift region 6 (the N type buffer region 7) over an end portion of the first body region 4. A gate electrode 13 is formed on the gate insulating film 12 and extends to part of the field oxide film 15. An emitter electrode 16 is formed on the first emitter region 8 and the body contact diffusion region 11, and is connected to the first emitter region 8 and the body contact diffusion region 11. A collector electrode 17 is formed on the collector region 10 and is connected to the collector region 10.

The second emitter region 9, which is a characteristic of the present disclosure, extends laterally in dimensions longer than the depth of the second emitter region 9 and not beyond an end portion of the first body region 4 under the gate electrode 13, in an area from an end portion of the first emitter region 8 closer to the gate electrode 13 to a region under the gate electrode 13.

Figure 2:
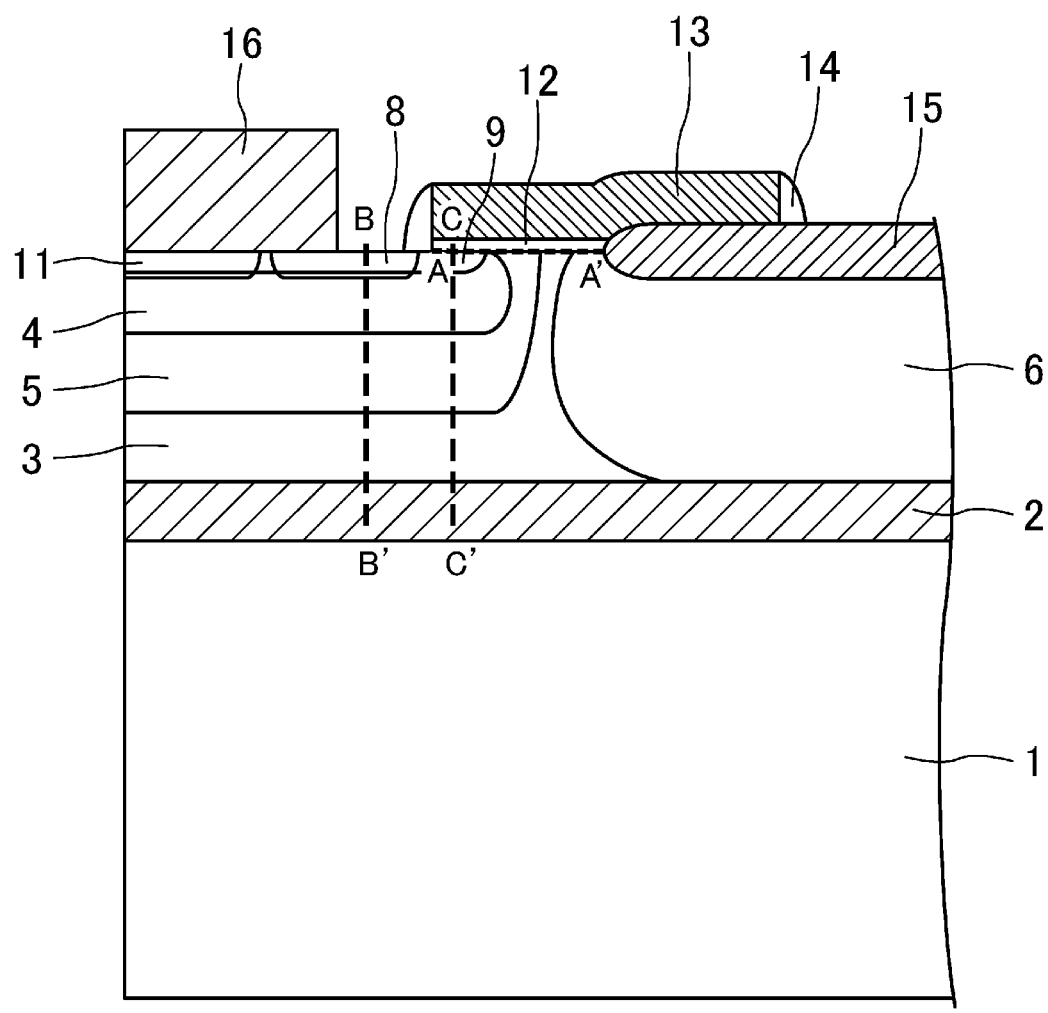
FIG. 2 is an enlarged cross section of a main part of the horizontal IGBT of the first embodiment.
Figure 3:
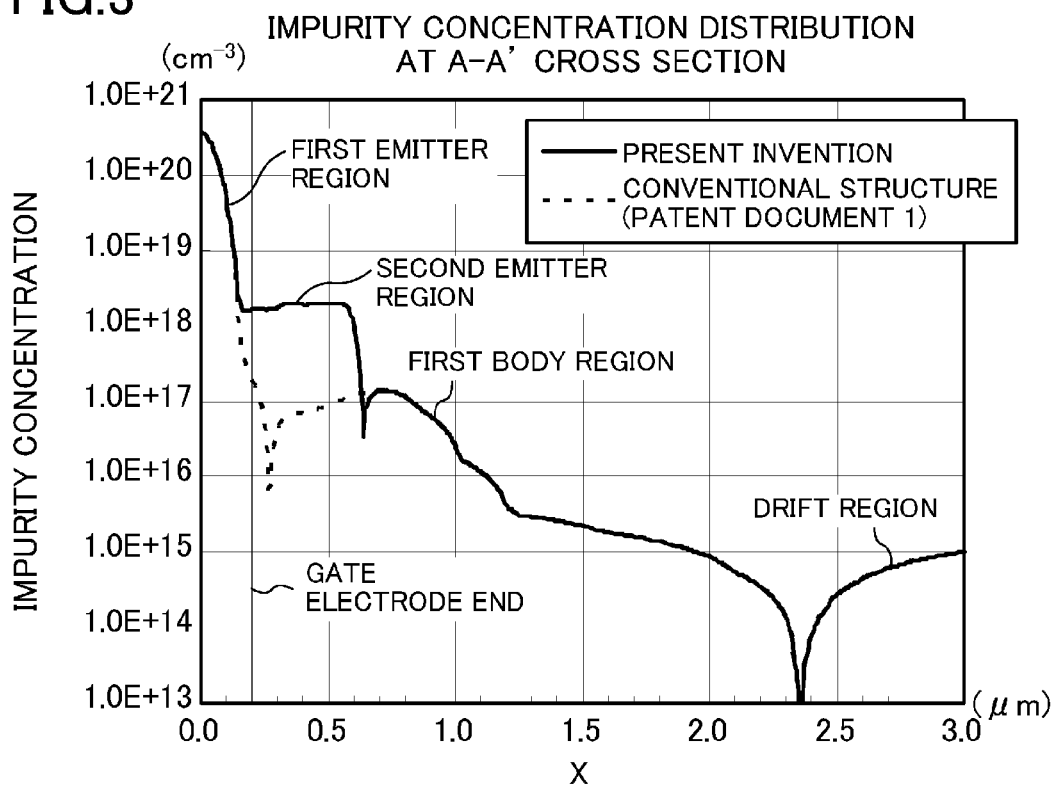
FIG. 3 shows impurity concentration distribution at a cross section taken along the line A-A' of each of the horizontal IGBT of the first embodiment and a conventional horizontal IGBT disclosed in Patent Document 1.

FIG. 3 shows the impurity concentration distribution of the first emitter region 8, the second emitter region 9, and the first body region 4 in the lateral direction (the A-A' direction) from the first emitter region 8 along a surface region of the first body region 4, in the enlarged view of the emitter region and its surroundings shown in FIG. 2.

As shown in FIG. 3, the overlapping dimension where the gate electrode 13 and the second emitter region 9 overlap each other is about 0.4 μm, and the overlapping dimension almost reaches the highest impurity concentration of the first body region 4. Data about the conventional structure of Patent Document 1 is also shown for comparison.

Figure 4:
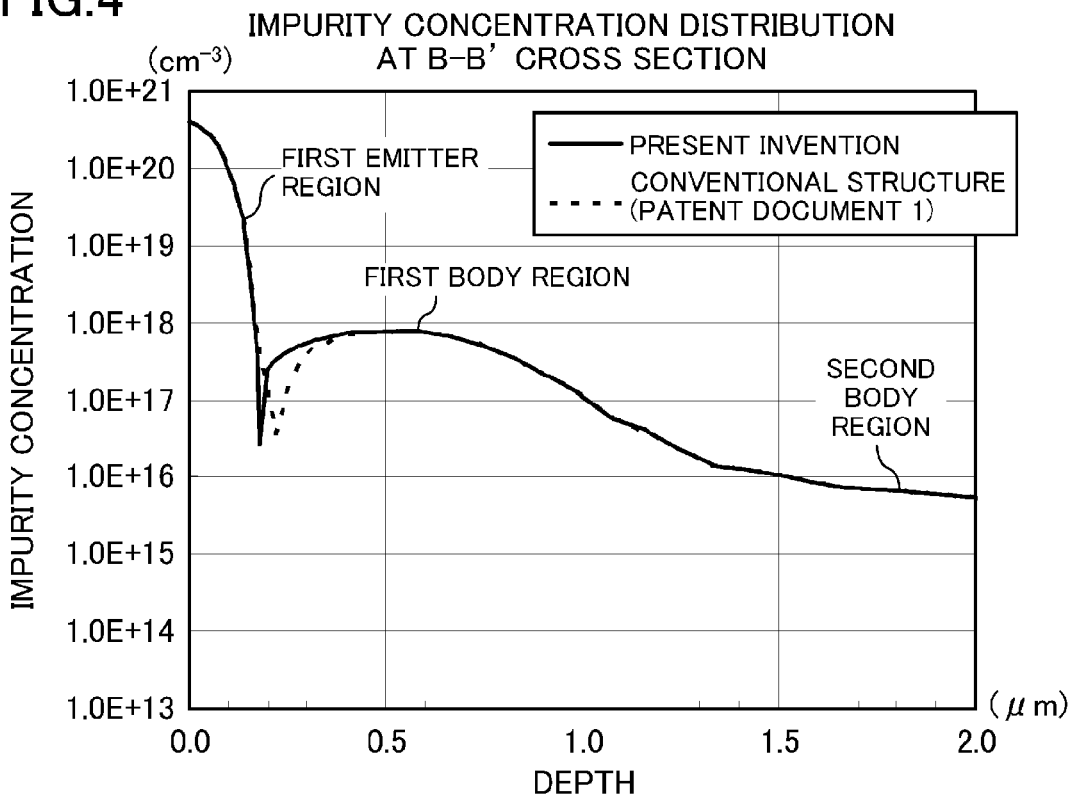
FIG. 4 shows impurity concentration distribution at a cross section taken along the line B-B' of each of the horizontal IGBT of the first embodiment and the conventional horizontal IGBT disclosed in Patent Document 1.

FIG. 4 shows the impurity concentration distribution of the first emitter region 8 and the first body region 4 in a vertical direction (the B-B' direction) shown in FIG. 2.

As shown in FIG. 4, the surface concentration of the first emitter region 8 is about slightly more than 1E+20 atoms/cm$^3$, and the depth thereof is about 0.2 μm. Data about the conventional structure of Patent Document 1 is also shown for comparison.

Figure 5:
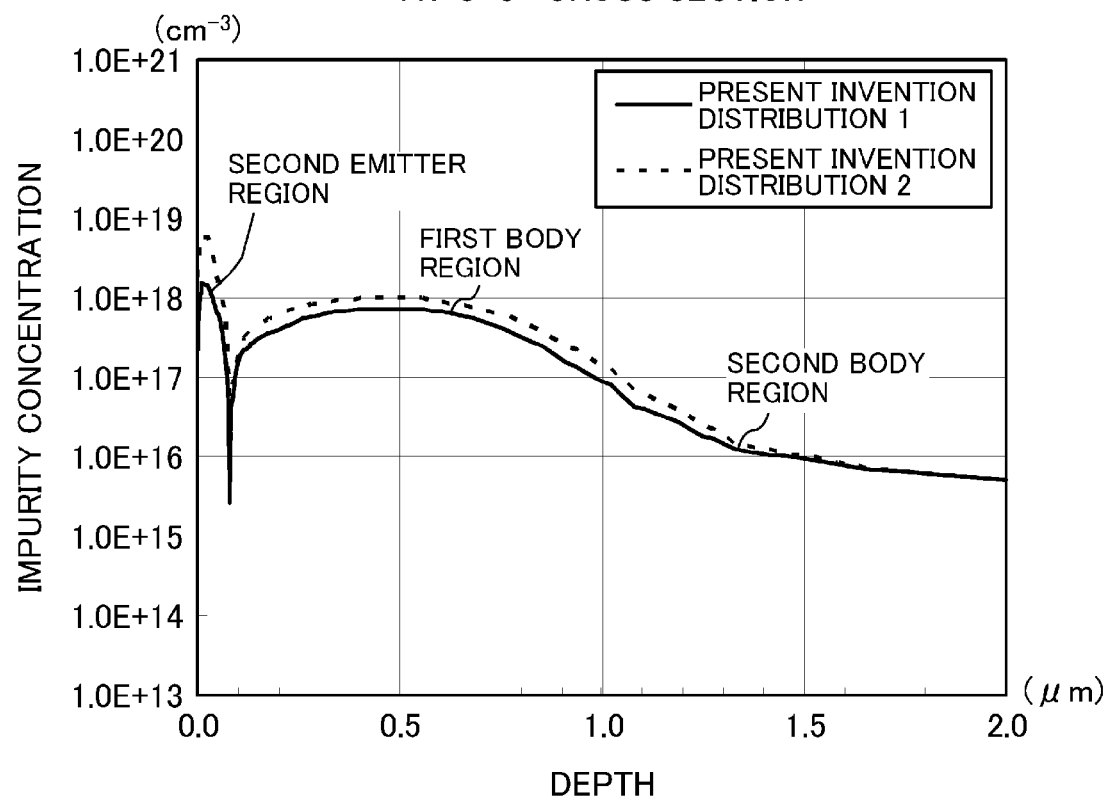
FIG. 5 shows impurity concentration distribution at a cross section taken along the line C-C' of each of the horizontal IGBT of the first embodiment and the conventional horizontal IGBT disclosed in Patent Document 1.

FIG. 5 show the impurity concentration distribution of the second emitter region 9 and the first body region 4 in the vertical direction (the C-C' direction) shown in FIG. 2.

In FIG. 5, distributions under two types of implantation conditions in the configuration of the present disclosure are shown. In FIG. 5, the distribution 2 shows the case in which larger dose amounts are implanted in both of the P type first body region 4 and the N type second emitter region 9, compared to the distribution 1. In both of the distributions, the surface concentration of the second emitter region 9 is in a range of 1E+18 atoms/cm$^3$ to 1E+19 atoms/cm$^3$, and the depth thereof is about 0.1 μm. As clearly shown from the comparison with the case shown in FIG. 4, the diffusion depth of the second emitter region 9 is shallower than the diffusion depth of the first emitter region 8. The diffusion depth of the second emitter region 9 may be in a range of 0.05 μm to 0.2 μm.

As known from the above description, it is clear that the lateral dimension of the second emitter region 9 under the gate electrode 13 is greater than the diffusion depth of the second emitter region 9.

Figure 18A:
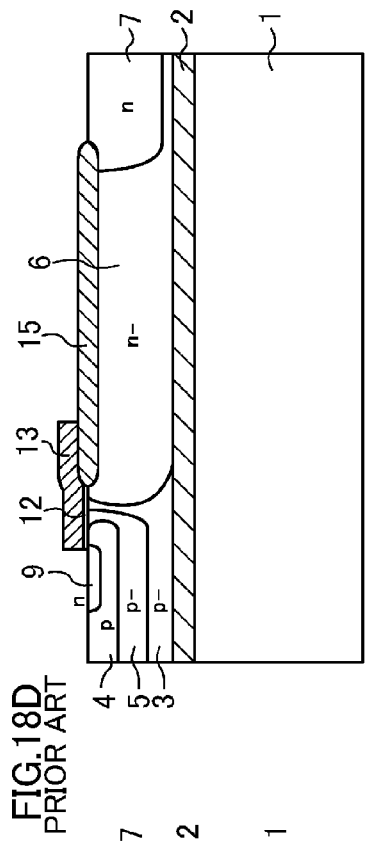
FIG. 18A to FIG. 18F are cross sectional drawings illustrating a step flow of a method of manufacturing the conventional horizontal IGBT of the Patent Document 1.
Figure 18B:
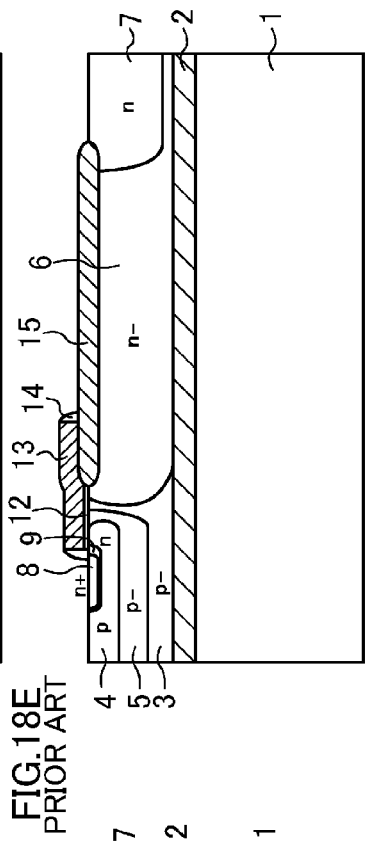
Figure 18C:
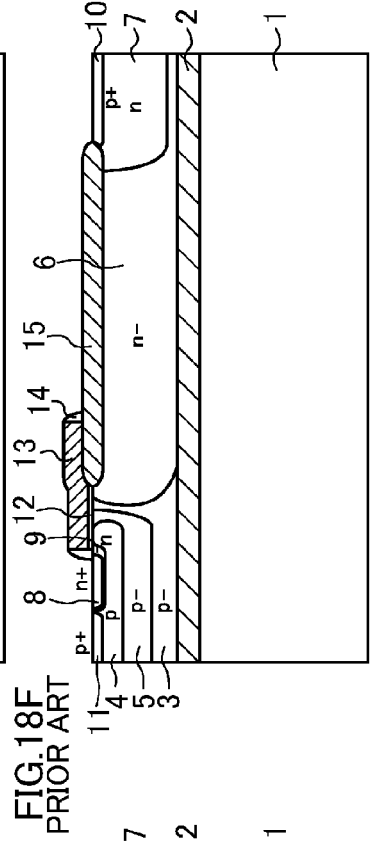
Figure 18D:
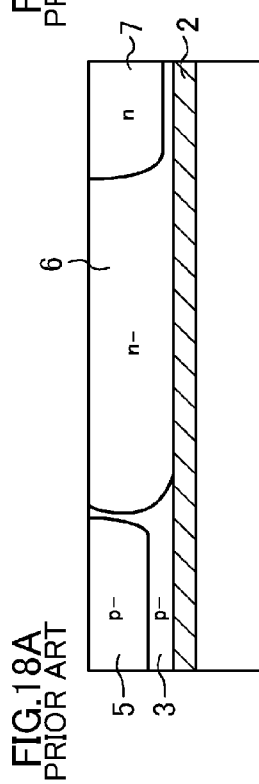
Figure 18E:
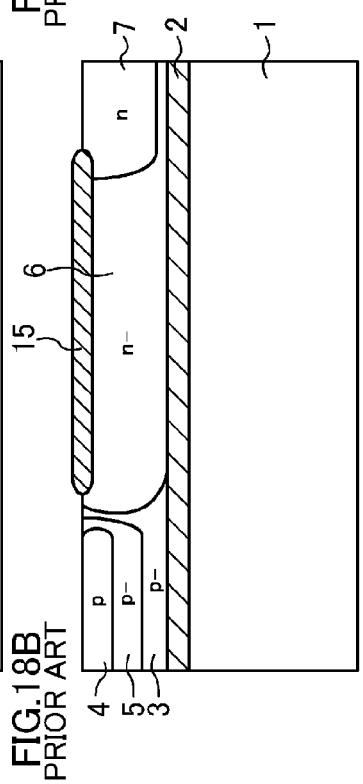
Figure 18F:
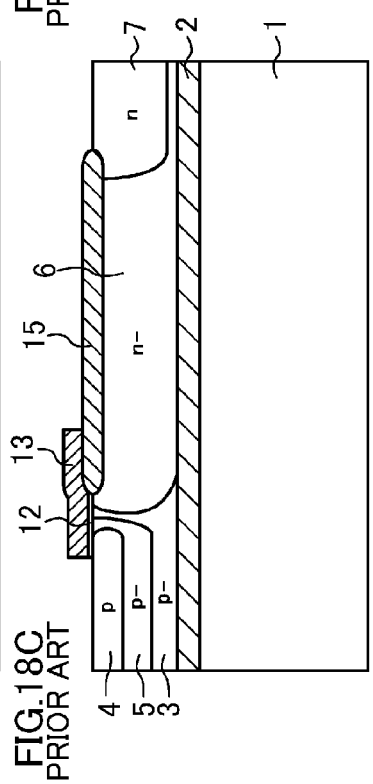
Figure 19:
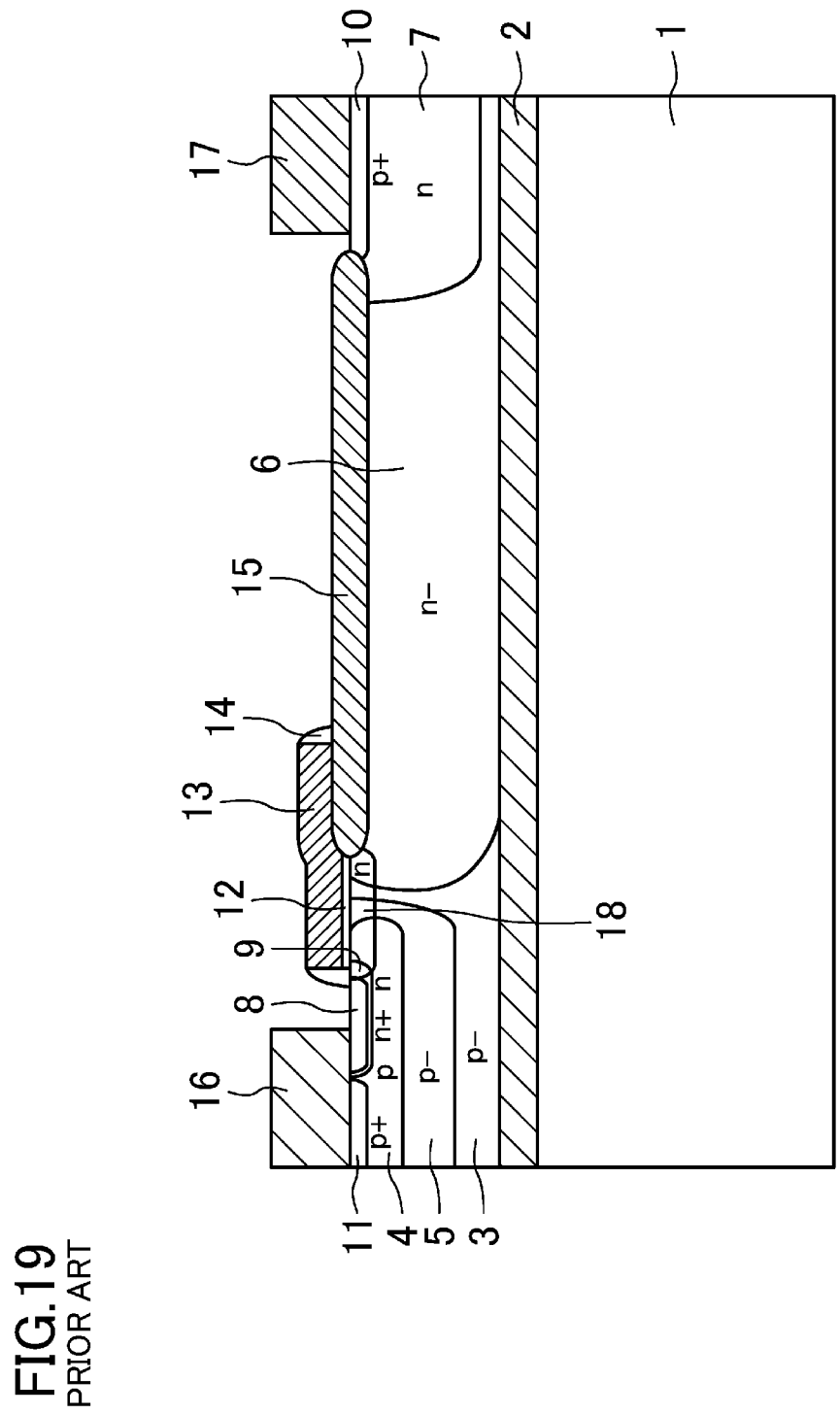
FIG. 19 is a schematic cross section of a horizontal IGBT having the conventional structure disclosed in Patent Document 1 combined with a characteristic of the conventional structure disclosed in Patent Document 2.

On the other hand, as clearly shown in FIG. 18C, FIG. 18D, and the description thereof, an end portion of the second emitter region 9 in the lateral direction in the conventional structure of Patent Document 1 does not much extend in the lateral direction since the second emitter region 9 is formed by implanting and diffusing from an end portion of the gate electrode 13 in a self-aligned manner. Thus, the end portion of the second emitter region 9 in the lateral direction almost coincide with the end portion of the gate electrode 13. Thus, when the lateral dimension of the second emitter region 9 under the gate electrode 13 is compared to the diffusion depth of the second emitter region 9 in the vertical direction, it is clear that the lateral dimension of the second emitter region 9 under the gate electrode 13 is shorter than the diffusion depth of the second emitter region 9, which is in an opposite relationship to the present disclosure.

Further, in the present disclosure, it is preferable to set a voltage drop in the second emitter region 9 to be larger than a voltage drop in the first body region 4 under the second emitter region 9. If a current flowing in the second emitter region 9 and a current flowing in the first body region 4 are almost the same, that relationship is the same as the relationship of a parasitic resistance (a sheet resistance). That is, it is preferable to set the parasitic resistance of the second emitter region 9 to be larger than the parasitic resistance of the first body region 4. In view of the vertical dimensions and mobility of the both regions, a peak value of the impurity concentration of the second emitter region 9 is preferably one to ten times the peak concentration of the first body region 4.

Characteristics of the on breakdown voltages of the present disclosure and the conventional structure in Patent Document 1 will be compared below.

Figure 6:
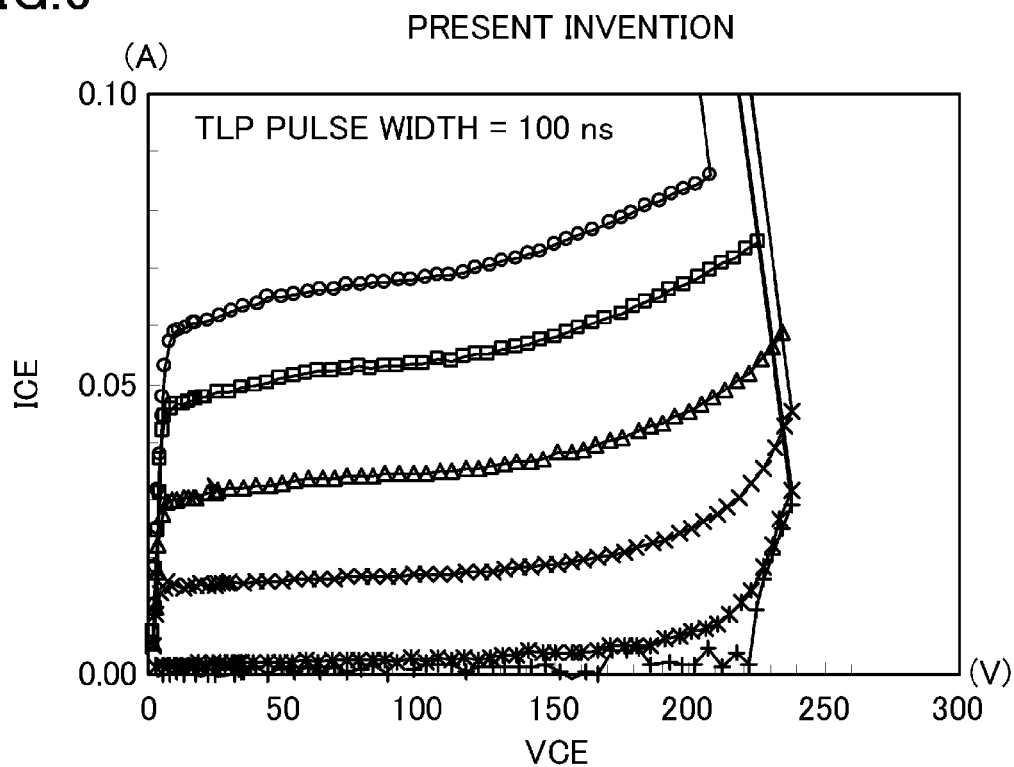
FIG. 6 is a current-voltage characteristic diagram showing a relationship between a collector current and a collector voltage of the horizontal IGBT of the first embodiment.
Figure 7:
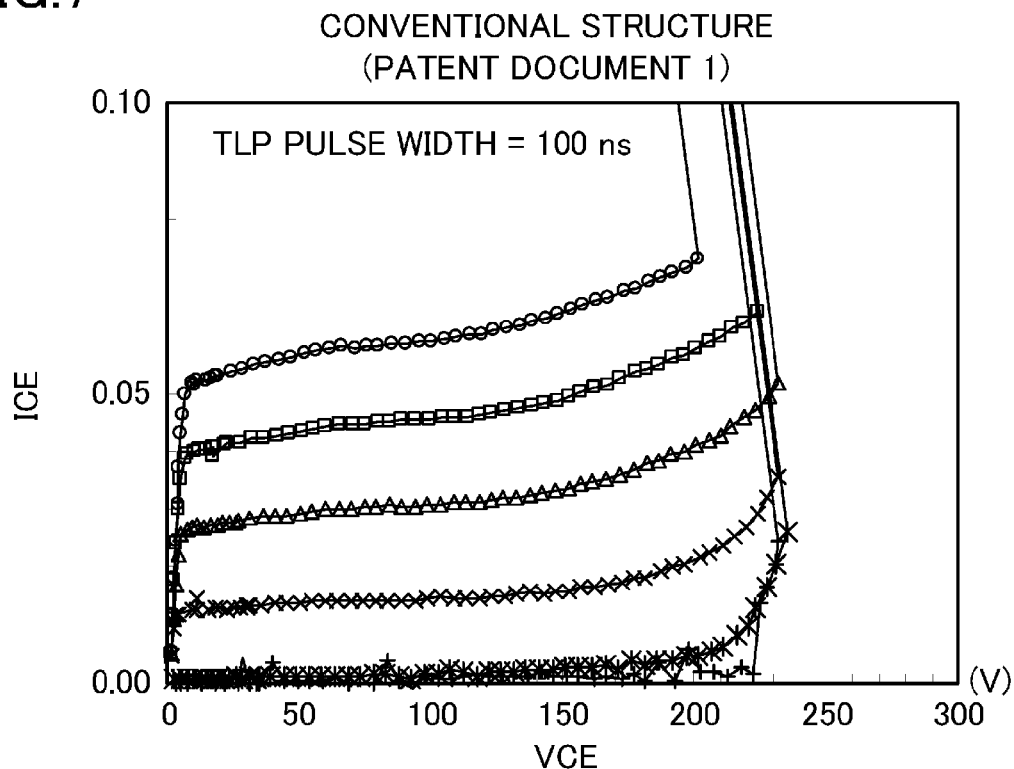
FIG. 7 is a current-voltage characteristic diagram showing a relationship between a collector current and a collector voltage of the conventional horizontal IGBT disclosed in Patent Document 1.
Figure 8:
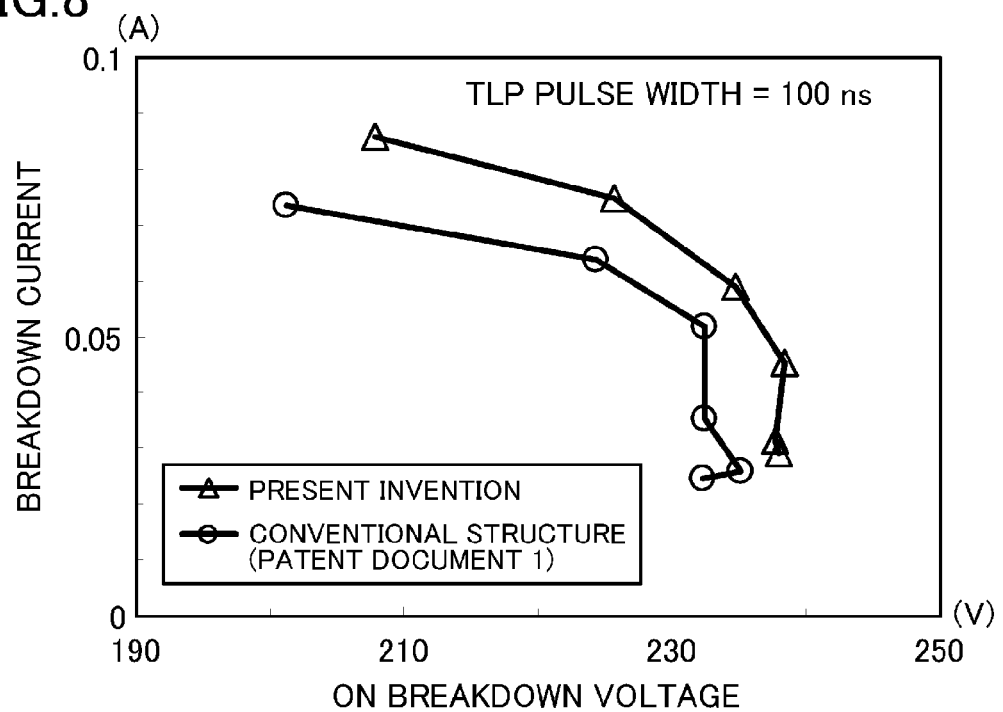
FIG. 8 is a characteristic diagram showing a relationship between a breakdown current and an on breakdown voltage of each of the horizontal IGBT of the first embodiment and the conventional horizontal IGBT disclosed in Patent Document 1.

FIG. 6 and FIG. 7 show a relationship between a collector current and a voltage of the present disclosure and the conventional structure (Patent Document 1), respectively. The current-voltage characteristics are data measured by changing a gate voltage and applying a pulse signal with a width of 100 ns to a collector terminal using a TLP measurement device. In the current-voltage characteristics, the collector voltage at which the breakdown occurs is an on breakdown voltage, and the collector current at that moment is a breakdown current. The above-described SOA can be obtained by plotting the on breakdown voltage and the breakdown current. The results are shown in FIG. 8. FIG. 8 shows that the SOA of the present disclosure is larger than the SOA of the conventional structure in Patent Document 1.

Figure 9:
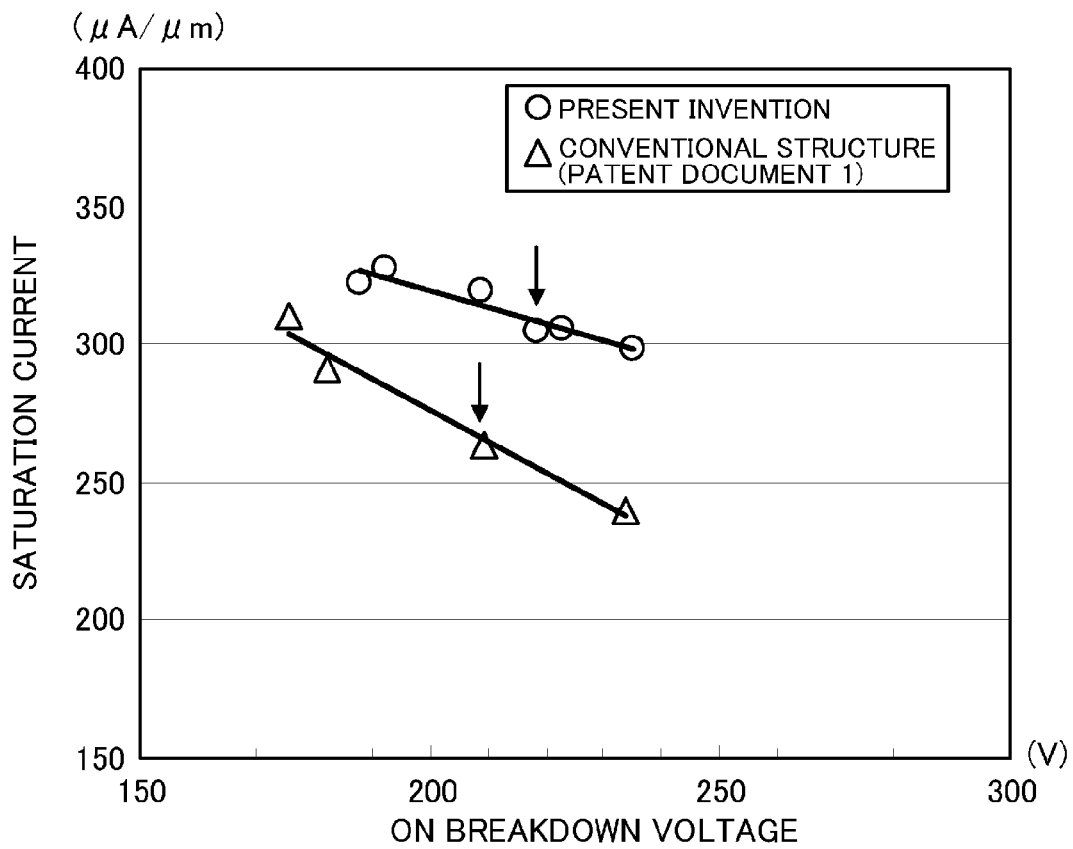
FIG. 9 is a characteristic diagram showing a relationship between a saturation current and an on breakdown voltage of each of the horizontal IGBT of the first embodiment and the conventional horizontal IGBT disclosed in Patent Document 1.

FIG. 9 shows a correlation graph of the on breakdown voltage at a time when a predetermined voltage is applied to the saturation current and the gate voltage at the time of measurement of a DC, and a pulse signal with a width of 100 ns is applied to a collector using a TLP measurement device. In FIG. 9, correlation curves of a plurality of elements with various overlapping dimensions between the gate electrode 13 and the first body region 4 are shown. In both of the present disclosure and the conventional structure, the overlapping dimensions are varied within a range of 0.1 μm to 0.7 μm from the left end to the right end of the drawing. The measurement points indicated by arrows are values when the present disclosure and the conventional structure have the same overlapping dimension, i.e., 0.4 μm.

FIG. 9 shows that in the present disclosure, the trade-off relationship between the saturation current and the on breakdown voltage is improved. The arrows indicate the portions at which the present disclosure and the conventional structure in Patent Document 1 have the same overlapping dimensions between the gate electrode and the first body region. In the present disclosure, the on breakdown voltage increases by about 9 V, despite an increase in the saturation current by 16% relative to the conventional structure in Patent Document 1.

Now, the superiority of the present disclosure to the conventional structure in Patent Document 1 combined with Patent Document 2 will be described.

Figure 10:
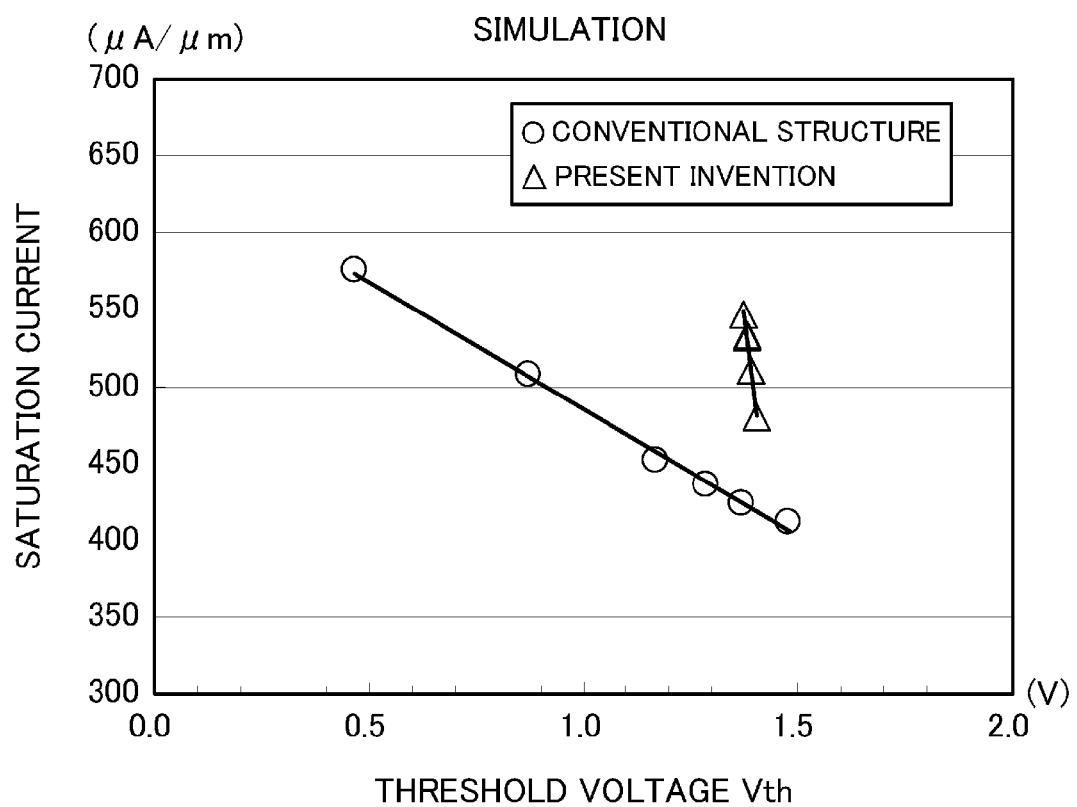
FIG. 10 shows a simulation of a relationship between a saturation current and a threshold voltage of each of the horizontal IGBT of the first embodiment and a conventional horizontal IGBT of Patent Document 1 combined with Patent Document 2.

FIG. 10 shows results of a simulation of correlation between the on breakdown voltage and the threshold voltage of each of the present disclosure and the conventional structure of Patent Document 1 combined with Patent Document 2. In the conventional structure of Patent Document 1 combined with Patent Document 2, the threshold voltage needs to be significantly reduced to increase a value of the saturation current, whereas in the present disclosure, the threshold voltage does not need to be much reduced. Thus, a reduction in the threshold voltage can be reduced.

This is due to a configuration in the conventional structure of Patent Document 1 combined with Patent Document 2 in which a surface diffusion layer 18 is provided in the entire region from an end portion of the second emitter region 9 to an end portion of the field oxide film 15.

To increase the saturation current, it is necessary to increase the dose amount in the surface diffusion layer 18 whose conductivity type is opposite to the conductivity type of the first body region 4. Here, a threshold voltage (Vth) is determined by a net concentration distribution of the P type impurity that remains after being cancelled out with the N type impurity amount at a portion in the channel surface where the P type impurity concentration shows a maximum value. Thus, the higher N type impurity concentration means that more P type impurities are cancelled out and that the net impurity concentration can be significantly and easily changed. Thus, the threshold voltage can also be easily changed.

In contrast, in the present disclosure, although the second emitter region 9 extends to an end portion of the first body region 4, the second emitter region 9 is not implanted in a region between the first body region 4 and the field oxide film 15. The inventors of the present disclosure found that there is a region with a high P type impurity concentration near the end portion of the first body region 4, due to penetration of boron ions at a tapered portion of a mask material (a resist). Even if the impurity concentration of the second emitter region 9 is increased, a half of the region where the P type impurity concentration is higher than the impurity concentration distribution of the conventional structure disappears in the second emitter region 9. However, about the other half of the region remains, and this remaining portion substantially determines a threshold voltage. As a result, even if the dose amount in the second emitter region 9 is increased, the threshold voltage does not abruptly drop. That is, in the present disclosure, the channel length can be shortened without significantly changing the threshold voltage.

A manufacturing method according to the first embodiment will be described below, using cross sections in FIG. 11A to FIG. 11E illustrating a step flow of the method.

Figure 11A:
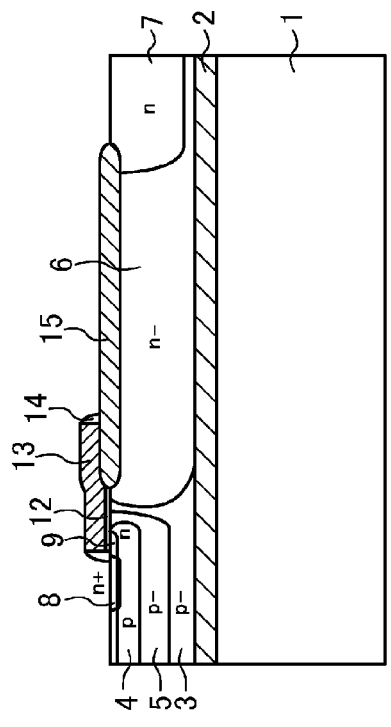
FIG. 11A to FIG. 11E are cross sections illustrating a step flow of a method of manufacturing the horizontal IGBT of the first embodiment.

First, as shown in FIG. 11A, a diffusion technique, such as ion implantation, photolithography, and a drive-in technique (a heat treatment), is repeatedly performed on an SOI substrate including a supporting substrate 1, a buried oxide film 2 with a thickness of 2.0 μm, and a p-type semiconductor layer 3 with a thickness of 3.5 μm, thereby sequentially forming a second body region 5, an N type buffer region 7, and an N⁻ type drift region 6 in the p-type semiconductor layer 3.

Figure 11D:
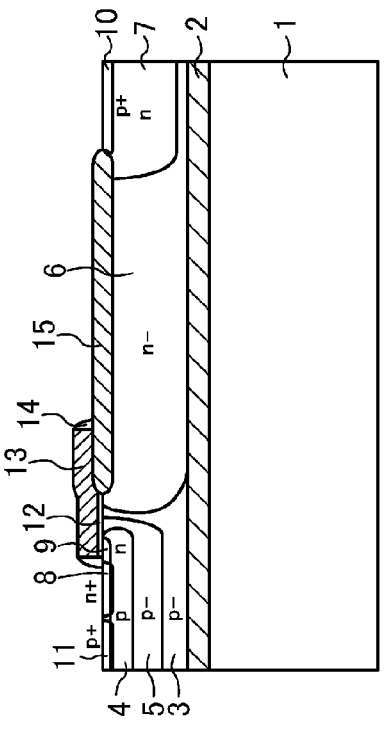
Figure 11B:
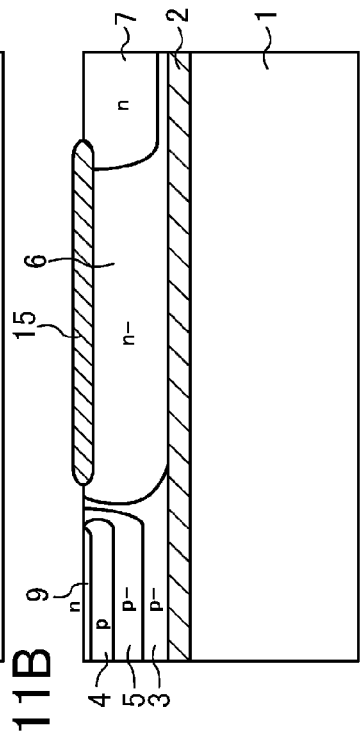

Next, as shown in FIG. 11B, a field oxide film 15 with a thickness of 540 nm is formed in an upper portion of the N⁻ type drift region 6 so as to overlap with part of the N type buffer region 7. After that, as a characteristic step of the present disclosure, a first body region 4 and an N type second emitter region 9 are formed by successively performing ion implantation, using a same resist film.

Figure 12:
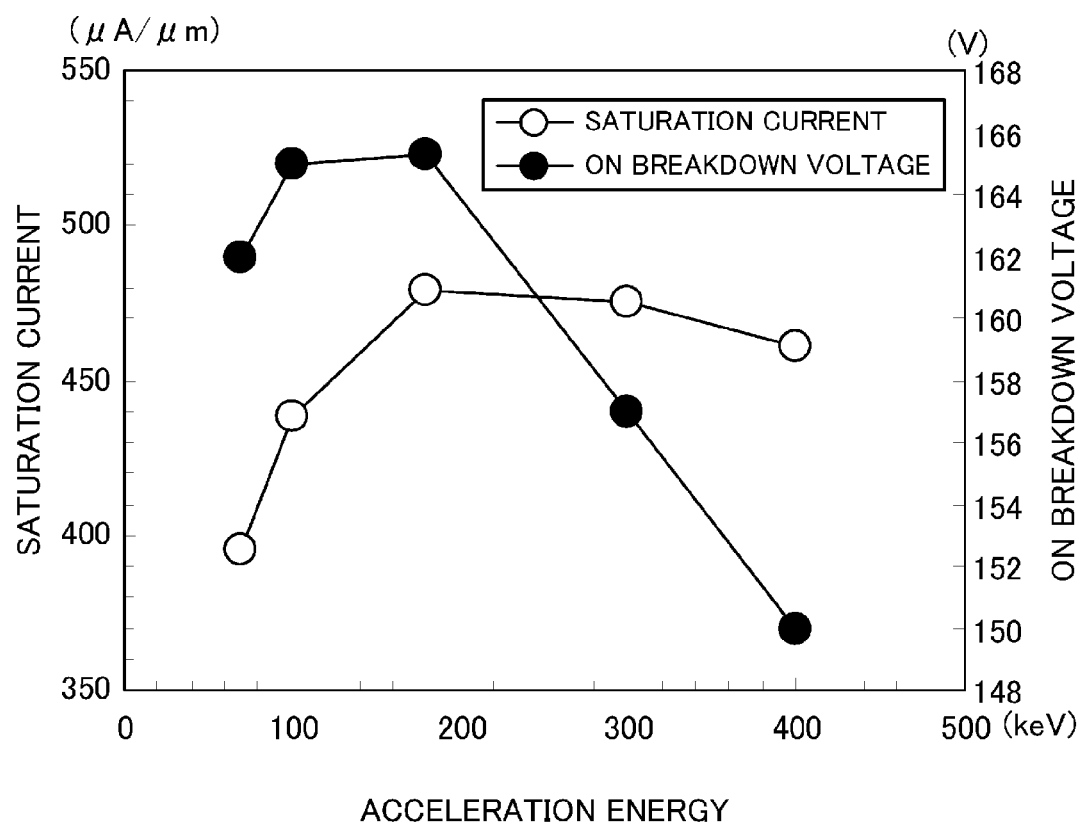
FIG. 12 shows a simulation of the dependency of the saturation current and the on breakdown voltage in a first body region of the horizontal IGBT of the first embodiment, on acceleration energy.

To form the first body region 4, it is preferable to use boron (B) ions with acceleration energy of 180 keV and a dose amount of about 5E+13 ions/cm² to 8E+13 ions/cm². The acceleration energy of the boron ions is most preferably about 180 keV in view of the trade-off relationship between the on breakdown voltage and the saturation current. FIG. 12 shows a simulation result of the dependency of the saturation current and the on breakdown voltage on the acceleration energy. If the acceleration energy is lower than 180 keV, the surface concentration increases, and the saturation current decreases. On the other hand, if the acceleration energy is higher than 180 keV, the on breakdown voltage is reduced. This may be because the P type impurity concentration directly under the second emitter region 9 and the first emitter region 8 is lowered and this increases the current gain α of the parasitic NPN transistor. Thus, it is not very suitable to form two layers, that is, a P type buried structure with a high concentration which is formed in a deep portion by performing high acceleration energy injection up to several mega-electron volts, and a P type surface layer with a low concentration which is formed from the surface, in an attempt to improve the trade-off relationship between the on breakdown voltage and the saturation current.

On the other hand, the second emitter region 9 is formed by implanting arsenic (As) ions with acceleration energy of 70 keV and a dose amount of about 1E+13 ions/cm² to 4E+13 ions/cm². If the acceleration energy in forming the second emitter region 9 is too high, an N type region is formed under the body contact region 11 due to the second emitter region 9, which leads to an unstable body potential. Thus, the acceleration energy in forming the second emitter region 9 is preferably about 50 keV to 100 keV in the case of using the arsenic ions. A region extending from an end portion of the first body region 4 to an end portion of the N type second emitter region 9 has a high channel resistance, and it is this region that substantially determines the threshold voltage. Since the region (the channel region) is formed in a self-aligned manner and the channel length can be substantially shortened, variations in the dimensions can also be reduced.

Figure 11E:
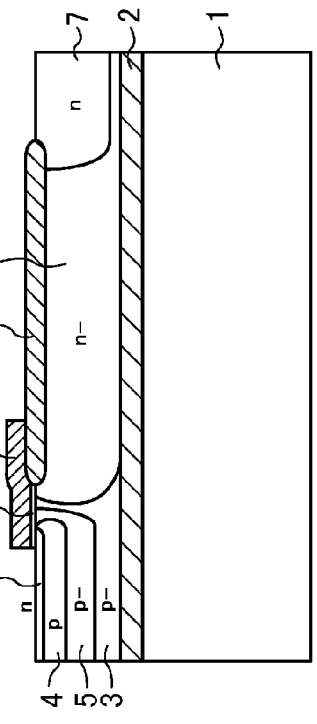
Figure 11C:
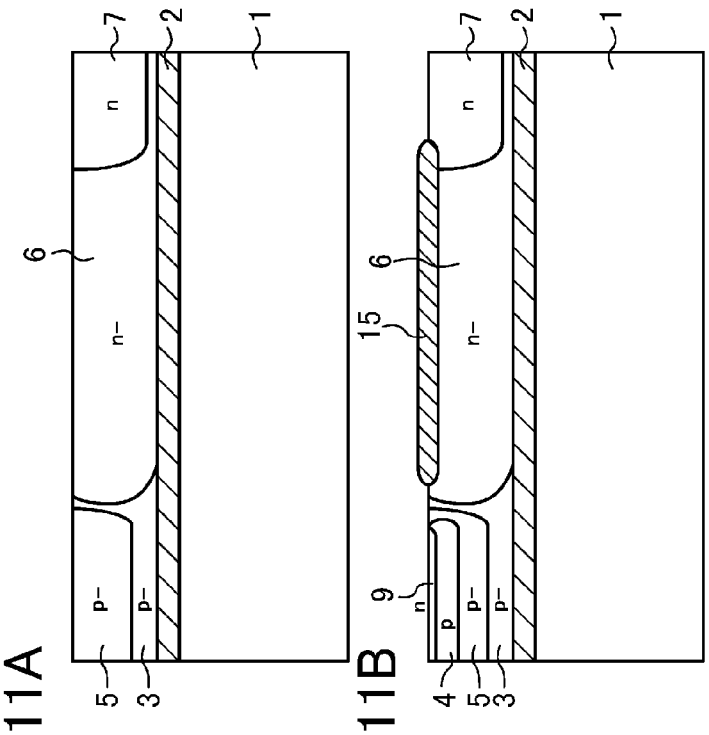

Next, as shown in FIG. 11C, a gate insulating film 12 is formed on the channel region and the field oxide film 15. After that, a gate electrode 13 made of N type polysilicon doped in high concentration is formed on the gate insulating film 12.

Next, as shown in FIG. 11D, an insulating film as a sidewall spacer 14 is formed on a sidewall of the gate electrode 13. After that, arsenic ions are implanted, thereby forming an N⁺ type first emitter region 8.

Next, as shown in FIG. 11E, a p⁺ type body contact region 11 and a P⁺ type collector region 10 are simultaneously formed by boron difluoride (BF₂) ion implantation. After that, although not shown, an insulating film is formed on the entire surface of the P type semiconductor layer 3, and contact holes are selectively formed in part of the insulating film. Then, a multilayer structure comprised of an interconnect that includes an emitter electrode and a collector electrode, and of the insulating film is formed. Further, an insulating film for protection is formed to cover the surface.

As described above, one of the characteristics of the present embodiment is that an extension structure of the second emitter region 9 extending in a lateral direction to a region under the gate electrode is longer than the diffusion depth of the second emitter region 9 itself, and extends in dimensions not beyond an end portion of the first body region 4.

Specifically, in the present embodiment, the second emitter region 9 and the first body region 4 are first formed in a self-aligned manner, thereby substantially shortening the channel length, compared to the conventional structure of Patent Document 1. As a result, it is possible to reduce the channel resistance, and therefore the saturation current can be increased.

Further in the present embodiment, the concentration of the second emitter region 9 is significantly lower than the concentration of the first emitter region 8, and the second emitter region 9 extends to reach an end portion of the first body region 4. Since the concentration of the second emitter region 9 is as low as the peak concentration of the first body region 4, a voltage drop occurs when a current flows from the first emitter region 8 through the channel. A hole current flows into the first body region 4 under the second emitter region 9, causing a voltage drop. If this voltage drop is less than the voltage drop in the second emitter region 9, a forward bias voltage to the first body region 4 increases beyond the built-in potential more at an end portion of the first emitter region 8 than at an end portion of the second emitter region 9. Thus, the parasitic NPN transistor consisting of the second emitter region 9/the first body region 4/the N type drift region 6 is less likely to be on, whereas the parasitic NPN transistor consisting of the first emitter region 8/the first body region 4/the N⁻ type drift region 6 is turned on.

In the conventional structure, as described above, the diffusion depth of the second emitter region 9 is deeper than that of the first emitter region 8, whereas in the present embodiment, the diffusion depth of the second emitter region 9 is shallower than that of the first emitter region 8. It is thus possible to achieve a higher P type impurity concentration in the first body region 4 under the first emitter region 8. Since this configuration can reduce the parasitic resistance Rb of the first body region 4, operations of the parasitic NPN transistor can be reduced, compared to the conventional structure of Patent Document 1.

That is, the extension of the second emitter region 9 in the lateral direction to the region under the gate electrode 13 is effective in reducing the channel length. In contrast, the voltage drop in the first body region 4 under the second emitter region 9 does not affect the on operation of the parasitic NPN transistor. Thus, in the present embodiment, it is possible to increase the saturation current without lowering the on breakdown voltage, compared to the conventional structure of Patent Document 1.

Further, in the present embodiment, the diffusion depth of the second emitter region 9 is shallower than the diffusion depth of the P⁺ type body contact region 11. Since ions are implanted in the second emitter region 9 simultaneously with the ion implantations in the first body region 4, using the same resist mask, the ions are implanted in the body contact region 11, as well. For this reason, as described earlier, if the diffusion depth of the second emitter region 9 is deeper than the diffusion depth of the P⁺ type body contact region 11, an N type region is formed in a region under the body contact diffusion region 11. This configuration increases a contact resistance, and the body potential becomes unstable. Thus, as described in the present embodiment, it is preferable that the diffusion depth of the second emitter region 9 is shallower than the diffusion depth of the P⁺ type body contact region 11.

Moreover, in the present embodiment, the first body region 4 has a so-called retrograde profile in which the impurity concentration is low in the surface of the P type semiconductor layer 3, and increases with an increase in depth. As a result, the N type impurity concentration of the second emitter region 9 and the P type impurity concentration of the first body region 4 can be close to each other. This means that a lower surface concentration of the first body region 4 creates a greater difference between an N type impurity concentration and a P type impurity concentration in the surface, and therefore it is possible to reduce variations in the net N type impurity concentration.

In the present embodiment, the first body region 4, the second body region 5, and the N⁻ type drift region 6 have been illustrated and described as having a gap between the first body region 4 and the second body region 5, and the N⁻ type drift region 6 under the gate electrode 13, but the present disclosure is not limited to such a configuration. For example, the first body region 4 and the second body region 5, and the N⁻ type drift region 6 may be adjacent to (or contact with) one another.

Further, in the present embodiment, the body contact region 11 has been illustrated and described as being included in the first body region 4, but the present disclosure is not limited to such a configuration. For example, the body contact region 11 may be formed such that at least a portion thereof is in contact with the first body region 4.

(Second Embodiment)

Figure 13:
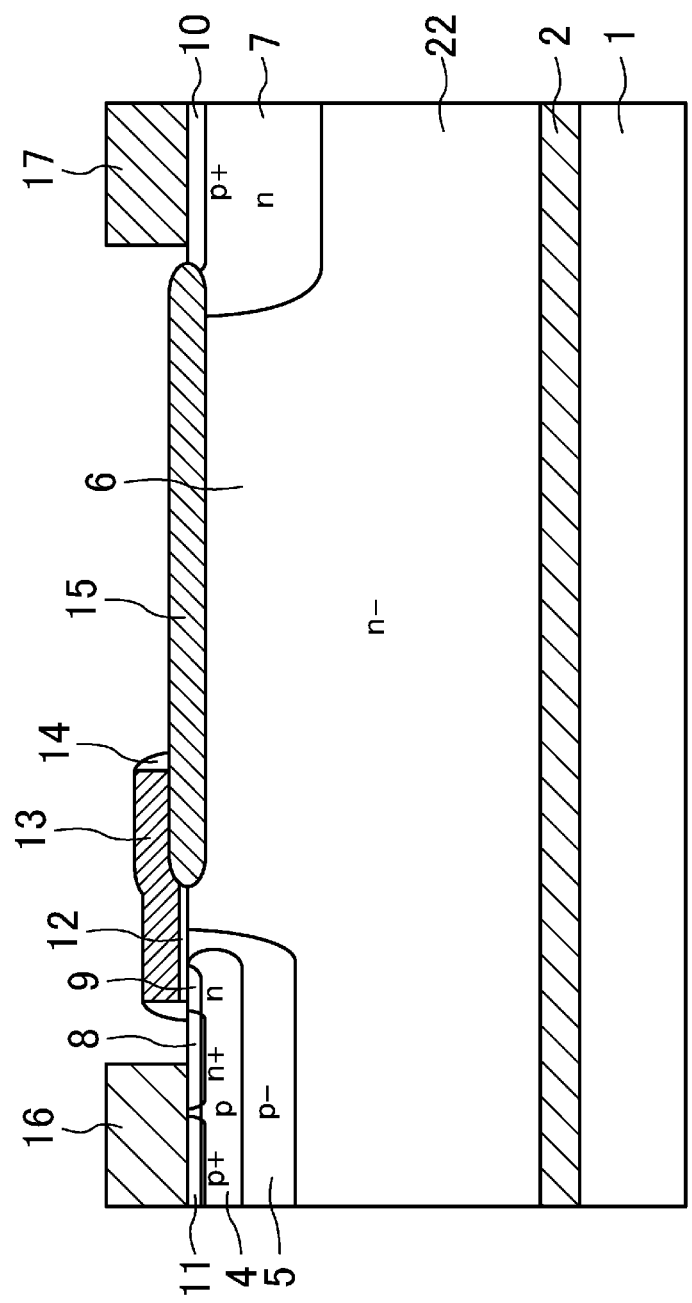
FIG. 13 is a schematic cross section of a horizontal IGBT of the second embodiment.

FIG. 13 schematically shows a cross section of an element structure of a semiconductor device of the second embodiment. In the following description, differences between the present embodiment and the first embodiment will be explained.

One of characteristics of the present embodiment is that an N type semiconductor layer 22 is used in place of the P type semiconductor layer 3 described in the first embodiment. A first body region 4 formed in an upper portion of the N type semiconductor layer 22 has a retrograde profile.

In the present embodiment, the second emitter region 9, which is a characteristic of the present disclosure, extends laterally in dimensions longer than the depth of the second emitter region 9 and not beyond an end portion of the first body region 4 under the gate electrode 13 in an area from an end portion of the first emitter region 8 closer to the gate electrode 13 to a region under the gate electrode 13. Thus, similar effects as those in the first embodiment can be obtained.

In the present embodiment, using the N type semiconductor layer 22 in place of the P type semiconductor layer 3 allows the thickness of the N type semiconductor layer 22 to be easily increased. In the first embodiment, in which the P type semiconductor layer 3 is used, it is necessary to add a diffusion layer as the N⁻ type drift region 6 and necessary to increase the length of time for a drive-in technique (a heat treatment) to achieve deeper diffusion of the N⁻ type drift region 6. For this reason, the N type semiconductor layer 22 can be employed as in the present embodiment.

In the present embodiment, the body contact region 11 has been illustrated and described as being included in the first body region 4, but the present disclosure is not limited to such a configuration. For example, the body contact region 11 may be formed such that at least a portion thereof is in contact with the first body region 4.

(Third Embodiment)

Figure 14:
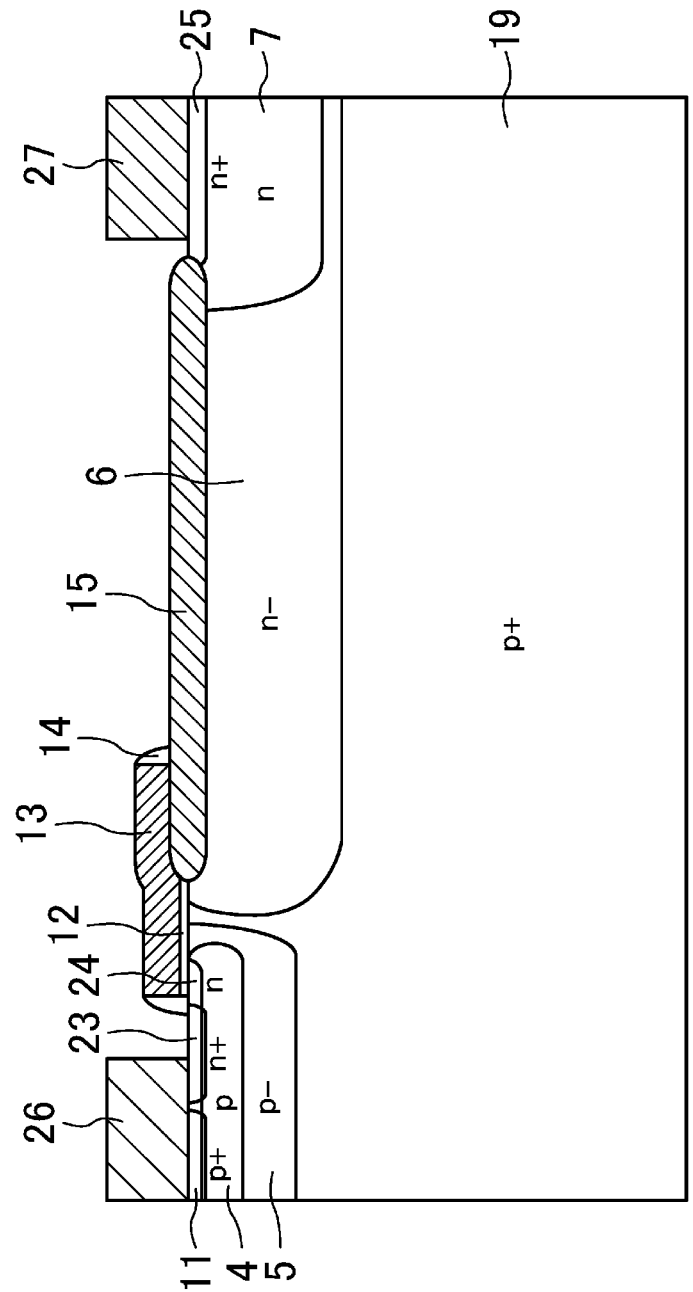
FIG. 14 is a schematic cross section of a horizontal MOS transistor of the third embodiment.

FIG. 14 schematically shows a cross section of an element structure of a semiconductor device of the third embodiment. In the following description, differences between the present embodiment and the first embodiment will be explained.

In the first and second embodiments, the present disclosure is intended for a horizontal IGBT, but in the present embodiment the present disclosure is intended for a general horizontal MOS transistor. In the present embodiment, it is not particularly necessary to use the SOI substrate, a P type silicon substrate 19 is employed. A first body region 4 diffused in an upper portion of the P type silicon substrate 19 has a retrograde profile.

Since the MOS transistor is described in the present embodiment, an N type drain region 25 is formed in place of the P⁺ type collector region 10 in the first embodiment.

A second source region 24, which is a characteristic of the present disclosure, extends laterally in dimensions longer than the depth of the second source region 24 and not beyond an end of the first body region 4 under the gate electrode 13 in an area from an end portion of a first source region 23 closer to the gate electrode 13 to a region under the gate electrode 13. The diffusion depth of the N type second source region 24 can be set to a range from 0.05 μm to 0.2 μm. A peak value of the impurity concentration of the second source region 24 can be set to a range from 1E+18 atoms/cm³ to 1E+19 atoms/cm³. A peak value of the impurity concentration of a second source region 4 can be set to a range of one to ten times the peak value of the impurity concentration of the P type first body region 4.

In the present embodiment, similarly to the first embodiment, the second source region 24 and the first body region 4 are first formed in a self-aligned manner, thereby substantially shortening the channel length. As a result, it is possible to reduce the channel resistance, and therefore the saturation current can be increased.

In the present embodiment, the concentration of the second source region 24 is significantly lower than the concentration of the first source region 23, and the second source region 24 extends to reach an end portion of the first body region 4. Since the concentration of the second source region 24 is as low as the peak concentration of the first body region 4, a voltage drop occurs when a current flows from the first source region 23 through the channel. A hole current, which is generated by avalanche breakdown due to an increase in drain voltage and an increase in electric field, flows into the first body region 4 under the second source region 24, causing a voltage drop. If this voltage drop is less than the voltage drop in the second source region 24, a forward bias voltage to the first body region 4 increases beyond the built-in potential more at an end portion of the first source region 23 than at an end portion of the second source region 24. Thus, the parasitic NPN transistor consisting of the second source region 24/the first body region 4/the N⁻ type drift region 6 is less likely to be on, whereas the parasitic NPN transistor consisting of the first source region 23/the first body region 4/the N⁻ type drift region 6 is turned on.

In the conventional structure, as described above, the diffusion depth of the second source region 24 is deeper than that of the first source region 23, whereas in the present embodiment, the diffusion depth of the second source region 24 is shallower than that of the first source region 23. It is thus possible to achieve a higher P type impurity concentration in the first body region 4 under the first source region 23. Since this configuration can reduce the parasitic resistance Rb of the first body region 4, operations of the parasitic NPN transistor can be reduced, compared to the conventional structure.

That is, the extension of the second source region 24 in the lateral direction to the region under the gate electrode 13 is effective in reducing the channel length. In contrast, the voltage drop in the first body region 4 under the second source region 24 does not affect the on operation of the parasitic NPN transistor.

Thus, in the present embodiment, as well, it is possible to increase the saturation current and lower an on resistance without lowering the on breakdown voltage, similarly to the case of using the IGBT in the first embodiment. Moreover, the present disclosure also has an effect of improving the current capabilities of horizontal MOS transistors.

In the present embodiment, the first body region 4, the second body region 5, and the N⁻ type drift region 6 have been illustrated and described as having a gap between the first body region 4 and the second body region 5, and the N⁻ type drift region 6, but the present disclosure is not limited to such a configuration. For example, the first body region 4 and the second body region 5, and the N⁻ type drift region 6 may be adjacent to (or contact with) one another.

Further, in the present embodiment, the body contact region 11 has been illustrated and described as being included in the first body region 4, but the present disclosure is not limited to such a configuration. For example, the body contact region 11 may be formed such that at least a portion thereof is in contact with the first body region 4.

(Fourth Embodiment)

Figure 15:
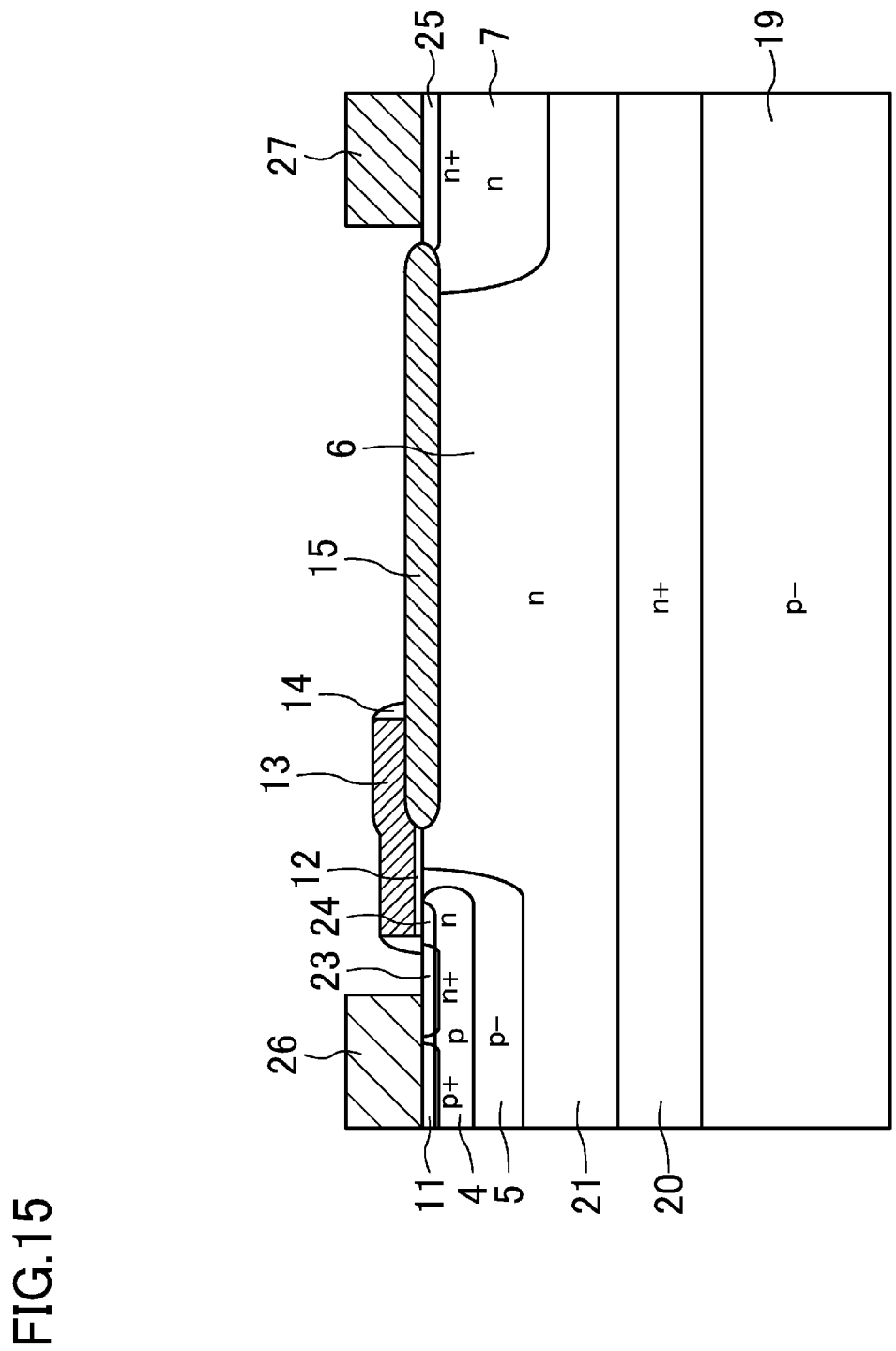
FIG. 15 is a schematic cross section of a horizontal MOS transistor of the fourth embodiment.
Figure 16:
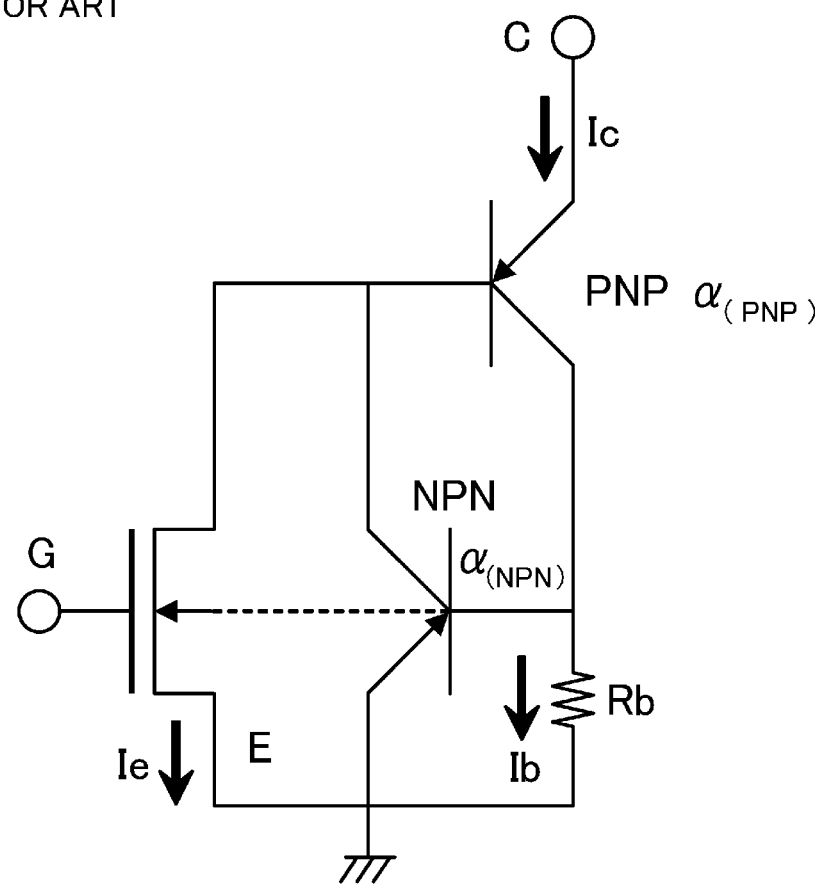
FIG. 16 is an equivalent circuit diagram of the conventional horizontal IGBT of the Patent Document 1.
Figure 17:
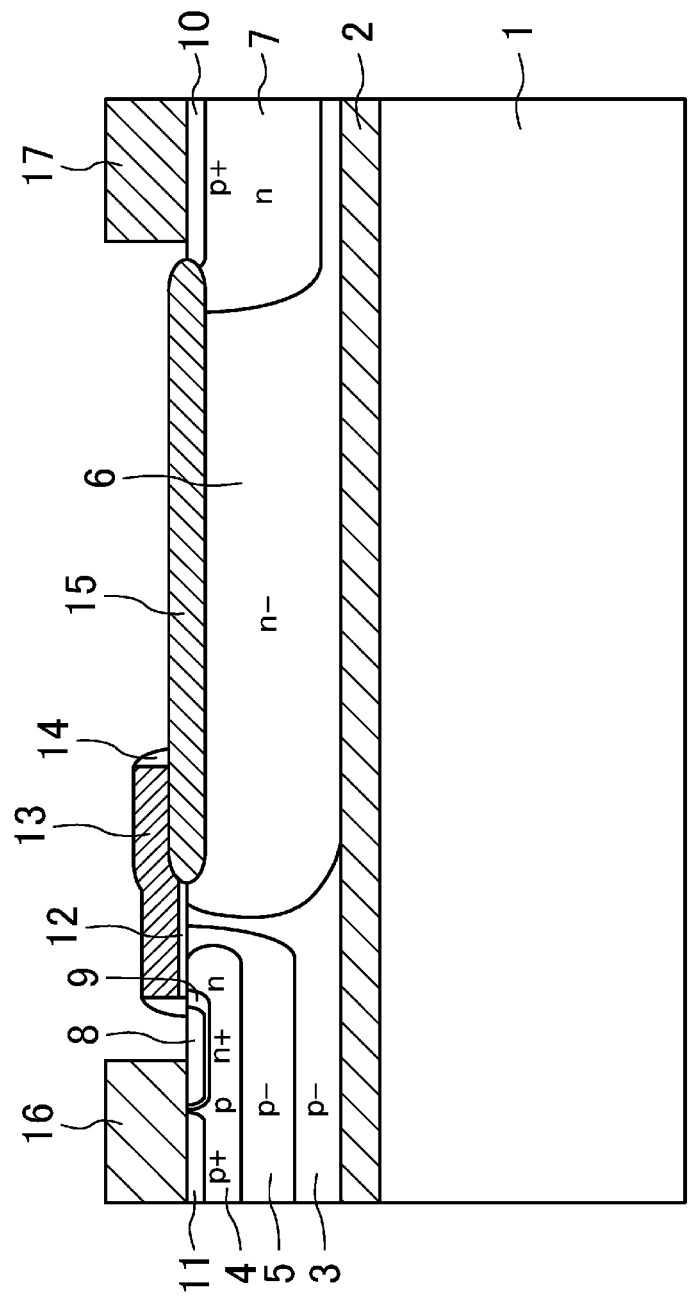
FIG. 17 is a schematic cross section of the conventional horizontal IGBT of the Patent Document 1.

FIG. 15 schematically shows a cross section of an element structure of a semiconductor device of the fourth embodiment. In the following description, differences between the present embodiment and the third embodiment will be explained.

In the third embodiment, the horizontal MOS transistor is formed in an upper portion of the P type silicon substrate 19, whereas in the present embodiment, an N type buried layer 20 and an N type epitaxial layer 21 which have high concentrations are layered on the P type semiconductor substrate 19, and a horizontal MOS transistor is formed in an upper portion of the obtained N type epitaxial layer 21.

A first body region 4 formed in a surface of the epitaxial layer 21 has a retrograde profile.

Employing the N type epitaxial layer 21 as in the present embodiment allows the formation of the N type buried layer 20 with a high concentration, and therefore it is easy to integrate the MOS transistor in the same semiconductor chip where a bipolar transistor is formed. Thus, the present disclosure is applicable in a Bi-CMOS provided with a MOS transistor with a high breakdown voltage.

In the present embodiment, the body contact region 11 has been illustrated and described as being included in the first body region 4, but the present disclosure is not limited to such a configuration. For example, the body contact region 11 may be formed such that at least a portion thereof is in contact with the first body region 4.

In the semiconductor device of the present disclosure, a saturation current can be increased and an on breakdown voltage can be increased in an operation of a transistor, and the present disclosure is specifically suitable for insulated gate bipolar transistors (IGBTs), horizontal MOS transistors, etc.

What is claimed is:

1. A semiconductor device, comprising:
a semiconductor layer formed above one principal surface of a supporting substrate, with a buried insulating film interposed therebetween;
a first body region of a first conductivity type formed in an upper portion of the semiconductor layer;
a drift region of a second conductivity type formed in an upper portion of the semiconductor layer to be adjacent to the first body region or apart from the first body region;
a buffer region of the second conductivity type formed in an upper portion of the drift region;
a first emitter region of the second conductivity type and a second emitter region of the second conductivity type having a concentration lower than a concentration of the first emitter region, the first emitter region and the second emitter region being formed in upper portions of the first body region;
a collector region of the first conductivity type formed in an upper portion of the buffer region;
a body contact region of the first conductivity type formed in an upper portion of the semiconductor layer such that at least part of the body contact region contacts the first body region;
a gate insulating film formed on the semiconductor layer, extending from the second emitter region toward the buffer region beyond the first body region, and covering part of the drift region, and a gate electrode formed on the gate insulating film; and
an emitter electrode contacting the first emitter region and the body contact region, and a collector electrode contacting the collector region, the emitter electrode and the collector electrode being formed on the semiconductor layer, wherein
the second emitter region contacts the first emitter region, and extends laterally to a portion under the gate electrode so as to be longer than a diffusion depth of the second emitter region and not beyond a lateral length of the first body region under the gate electrode, in an area from an end portion of the first emitter region closer to the gate electrode to a region under the gate electrode.

2. The semiconductor device of claim 1, wherein the diffusion depth of the second emitter region is shallower than a diffusion depth of the body contact region.

3. The semiconductor device of claim 1, wherein the diffusion depth of the second emitter region is shallower than a diffusion depth of the first emitter region.

4. The semiconductor device of claim 1, wherein a sheet resistance of the second emitter region is larger than a sheet resistance of the first body region.

5. The semiconductor device of claim 1, wherein a peak value of an impurity concentration of the second emitter region is in a range of one to ten times a peak value of an impurity concentration of the first body region.

6. The semiconductor device of claim 1, wherein a peak value of an impurity concentration of the second emitter region is in a range of 1E+18 atoms/cm³ to 1E+19 atoms/cm³.

7. The semiconductor device of claim 1, wherein the diffusion depth of the second emitter region is in a range of 0.05 μm to 0.2 μm.

8. The semiconductor device of claim 1, wherein the first body region has a retrograde profile.

9. The semiconductor device of claim 1, further comprising:
a second body region of the first conductivity type formed under the first body region so as to contact the first body region, and having a concentration lower than and a diffusion depth deeper than those of the first body region.

10. A semiconductor device, comprising:
a semiconductor layer of a second conductivity type formed above one principal surface of a supporting substrate, with a buried insulating film interposed therebetween;
a first body region of a first conductivity type formed in an upper portion of the semiconductor layer;
a buffer region of the second conductivity type formed in an upper portion of the semiconductor layer to be apart from the first body region;

a first emitter region of the second conductivity type and a second emitter region of the second conductivity type having a concentration lower than a concentration of the first emitter region, the first emitter region and the second emitter region being formed in upper portions of the first body region;

a collector region of the first conductivity type formed in an upper portion of the buffer region;

a body contact region of the first conductivity type formed in an upper portion of the semiconductor layer such that at least part of the body contact region contacts the first body region;

a gate insulating film formed on the semiconductor layer, extending from the second emitter region toward the buffer region beyond the first body region, and covering part of the semiconductor layer, and a gate electrode formed on the gate insulating film; and an emitter electrode contacting the first emitter region and the body contact region, and a collector electrode contacting the collector region, the emitter electrode and the collector electrode being formed on the semiconductor layer, wherein the second emitter region contacts the first emitter region, and extends laterally to a portion under the gate electrode so as to be longer than a diffusion depth of the second emitter region and not beyond a lateral length of the first body region under the gate electrode, in an area from an end portion of the first emitter region closer to the gate electrode to a region under the gate electrode.

11. A semiconductor device, comprising:
a semiconductor substrate of a first conductivity type;
a first body region of the first conductivity type formed in an upper portion of the semiconductor substrate on one principal surface side;
a drift region of a second conductivity type formed in an upper portion of the semiconductor substrate on the one principal surface side to be adjacent to the first body region or apart from the first body region;
a buffer region of the second conductivity type formed in an upper portion of the drift region;
a first source region of the second conductivity type and a second source region of the second conductivity type having a concentration lower than a concentration of the first source region, the first source region and the second source region being formed in upper portions of the first body region;
a drain region of the second conductivity type formed in an upper portion of the buffer region;
a body contact region of the first conductivity type formed in an upper portion of the semiconductor substrate on the one principal surface side such that at least part of the body contact region contacts the first body region;
a gate insulating film formed on the semiconductor substrate, extending from the second source region toward the buffer region beyond the first body region, and covering part of the drift region, and a gate electrode formed on the gate insulating film; and
a source electrode contacting the first source region and the body contact region, and a drain electrode contacting the drain region, the source electrode and the drain electrode being formed on the semiconductor substrate, wherein
the second source region contacts the first source region, and extends laterally to a portion under the gate electrode so as to be longer than a diffusion depth of the second source region and not beyond a lateral length of the first body region under the gate electrode, in an area from an end portion of the first source region closer to the gate electrode to a region under the gate electrode.

12. The semiconductor device of claim 11, wherein
the diffusion depth of the second source region is shallower than a diffusion depth of the body contact region.

13. The semiconductor device of claim 11, wherein
the diffusion depth of the second source region is shallower than a diffusion depth of the first source region.

14. The semiconductor device of claim 11, wherein
a sheet resistance of the second source region is larger than a sheet resistance of the first body region.

15. The semiconductor device of claim 11, wherein
a peak value of an impurity concentration of the second source region is in a range of one to ten times a peak value of an impurity concentration of the first body region.

16. The semiconductor device of claim 11, wherein
a peak value of an impurity concentration of the second source region is in a range of 1E+18 atoms/cm$^3$ to 1E+19 atoms/cm$^3$.

17. The semiconductor device of claim 9, wherein
the diffusion depth of the second source region is in a range of 0.05 μm to 0.2 μm.

18. A semiconductor device, comprising:
a semiconductor substrate of a first conductivity type;
an epitaxial region of the second conductivity type formed in an upper portion of the semiconductor substrate on one principal surface side;
a first body region of the first conductivity type formed in an upper portion of the epitaxial region;
a buffer region of the second conductivity type formed in an upper portion of the epitaxial region to be apart from the first body region;
a first source region of the second conductivity type and a second source region of the second conductivity type having a concentration lower than a concentration of the first source region, the first source region and the second source region being formed in upper portions of the first body region;
a drain region of the second conductivity type formed in an upper portion of the buffer region;
a body contact region of the first conductivity type formed in an upper portion of the semiconductor substrate on the one principal surface side such that at least part of the body contact region contacts the first body region;
a gate insulating film formed on the semiconductor substrate, extending from the second source region toward the buffer region beyond the first body region, and covering part of the epitaxial region, and a gate electrode formed on the gate insulating film; and
a source electrode contacting the first source region and the body contact region, and a drain electrode contacting the drain region, the source electrode and the drain electrode being formed on the semiconductor substrate, wherein
the second source region contacts the first source region, and extends laterally to a portion under the gate electrode so as to be longer than a diffusion depth of the second source region and not beyond a lateral length of the first body region under the gate electrode, in an area from an end portion of the first source region closer to the gate electrode to a region under the gate electrode.

* * * * *